US009349678B2

(12) United States Patent
Ono et al.

(10) Patent No.: US 9,349,678 B2
(45) Date of Patent: May 24, 2016

(54) CHIP HAVING A PILLAR ELECTRODE OFFSET FROM THE BONDING PAD

(71) Applicant: Renesas Electronics Corporation, Kanagawa (JP)

(72) Inventors: Yoshihiro Ono, Kanagawa (JP); Nobuhiro Kinoshita, Kanagawa (JP); Tsuyoshi Kida, Kanagawa (JP); Jumpei Konno, Kanagawa (JP); Kenji Sakata, Kanagawa (JP); Kentaro Mori, Kanagawa (JP); Shinji Baba, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/750,009

(22) Filed: Jun. 25, 2015

(65) Prior Publication Data
US 2015/0380345 A1    Dec. 31, 2015

(30) Foreign Application Priority Data
Jun. 27, 2014   (JP) ................................ 2014-133351

(51) Int. Cl.
| H01L 23/48 | (2006.01) |
| H01L 21/00 | (2006.01) |
| B23K 31/00 | (2006.01) |
| H01L 23/495 | (2006.01) |
| H01L 23/544 | (2006.01) |
| H01L 23/00 | (2006.01) |

(52) U.S. Cl.
CPC ...... *H01L 23/49568* (2013.01); *H01L 23/4951* (2013.01); *H01L 23/4952* (2013.01); *H01L 23/49558* (2013.01); *H01L 23/544* (2013.01); *H01L 24/06* (2013.01); *H01L 24/14* (2013.01); *H01L 24/81* (2013.01)

(58) Field of Classification Search
CPC . H01L 23/544; H01L 24/14; H01L 23/49838; H01L 24/06; H01L 24/81
See application file for complete search history.

(56) References Cited

U.S. PATENT DOCUMENTS

| 6,229,220 B1 | 5/2001 | Saitoh et al. | |
| 2004/0069988 A1* | 4/2004 | Lin ..................... | G01R 31/2884 257/48 |
| 2005/0173801 A1* | 8/2005 | Mimura ................. | H01L 22/32 257/758 |
| 2007/0164279 A1* | 7/2007 | Lin ......................... | H01L 22/32 257/48 |
| 2007/0224798 A1* | 9/2007 | Miyazaki ................. | G01R 3/00 438/612 |
| 2011/0233585 A1 | 9/2011 | Kojima et al. | |
| 2013/0093079 A1* | 4/2013 | Tu ....................... | H01L 23/3192 257/737 |
| 2013/0193438 A1* | 8/2013 | Akiba ..................... | H01L 22/20 257/48 |
| 2014/0361299 A1* | 12/2014 | Akiba ..................... | H01L 22/20 257/48 |
| 2014/0361430 A1 | 12/2014 | Ono et al. | |

FOREIGN PATENT DOCUMENTS

| JP | 9-97791 A | 4/1997 |
| JP | 2011-204840 A | 10/2011 |
| JP | 2014-239155 A | 12/2014 |

* cited by examiner

*Primary Examiner* — Alonzo Chambliss
(74) *Attorney, Agent, or Firm* — Mattingly & Malur, PC

(57) ABSTRACT

The reliability of a semiconductor device is improved. A probe mark is formed on a probe region of a pad covered with a protective insulating film. And, a pillar-shaped electrode has a first portion formed on an opening region and a second portion that is extended over the probe region from the upper portion of the opening region. At this time, a center position of the opening region is shifted from a center position of the pillar-shaped electrode that is opposed to a bonding finger.

18 Claims, 28 Drawing Sheets

CHIP HAVING A PILLAR ELECTRODE OFFSET FROM THE BONDING PAD

CROSS-REFERENCE TO RELATED APPLICATION

The present application claims priority from Japanese Patent Application No. 2014-133351 filed on Jun. 27, 2014, the content of which is hereby incorporated by reference into this application.

TECHNICAL FIELD OF THE INVENTION

The present invention relates to a semiconductor device. For example, the present invention relates to a technique effectively applied to a semiconductor device including a semiconductor chip on which a pillar-shaped electrode is formed.

BACKGROUND

Japanese Patent Application Laid-Open Publication No. 1109-97791 (Patent Document 1) and Japanese Patent Application Laid-Open Publication No. 2011-204840 (Patent Document 2) have described a semiconductor device including a semiconductor chip on which a pillar-shaped electrode is formed.

SUMMARY

For example, when a heat load is applied by a temperature cycle test or others onto a semiconductor device having a mounting mode (packaging mode) in which a semiconductor chip with a pillar-shaped electrode formed thereon is mounted on a wiring substrate having a bonding finger to be a terminal, such a phenomenon as peel off has been seen at a joining interface between a pad and the pillar-shaped electrode of the semiconductor chip. This phenomenon is considered to be caused by application of a repetitive stress onto the joining portion between the pad and the pillar shaped electrode interposed between the bonding finger and the pad by the repetitive heating and cooling due to the heat load such as the temperature cycle test, because of a difference in a linear expansion coefficient between the wiring substrate and the semiconductor chip. Therefore, for example, the semiconductor device having the mounting mode in which a semiconductor chip with the pillar-shaped electrode formed thereon is mounted on the wiring substrate having the bonding finger to be a terminal has a margin for improvement from the viewpoint of preventing the peeling off occurring at the joining interface between the pad and the pillar-shaped electrode on the semiconductor chip.

Other object and novel characteristics will be apparent from the description of the present specification and the accompanying drawings.

A semiconductor device according to an embodiment has a pad partially covered with a protective insulating film, and a probe mark is formed in a probe region of this pad. Meanwhile, a pillar-shaped electrode to be connected to the pad has a first portion formed on an opening region of the pad that is exposed from the protective insulating film and a second portion that is extended over the protective insulating film covering the probe region. At this time, the center position in the opening region is shifted from the center position of the pillar-shaped electrode.

According to the embodiment, the reliability of the semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and others are described, the substantially approximate and similar shapes and others are included therein unless otherwise stated or except the case where it is conceivable that they are apparently excluded in principle. The same goes for the numerical value and the range described above.

Also, the same components are denoted by the same reference symbols throughout all the drawings for describing the embodiments, and the repetitive description thereof is omitted. Note that hatching is used even in a plan view so as to make the drawings easy to see.

(Embodiment)

<Mounting Configuration of Semiconductor Device>

Figure 1:
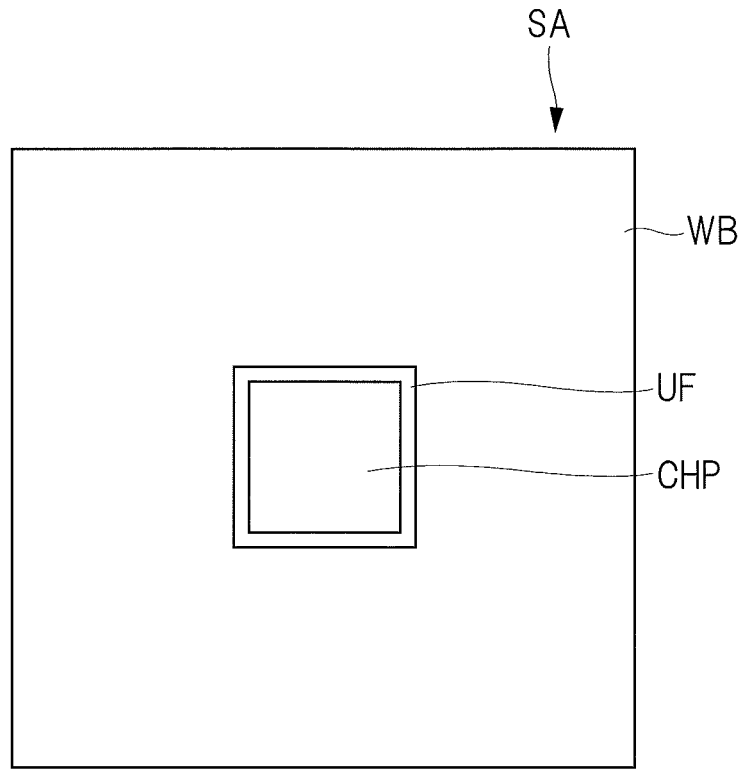
FIG. 1 is a top view showing a mounting configuration of a semiconductor device according to an embodiment.

FIG. 1 is a top view showing a mounting configuration of a semiconductor device SA according to the present embodiment. As shown in FIG. 1, the semiconductor device SA of the present embodiment has a wiring substrate WB having a rectangular shape, and a rectangular-shaped semiconductor chip. CHP is mounted on the center portion of this wiring substrate WB via a sealing material (under fill) UF. As shown in FIG. 1, the size of the semiconductor chip CHP is made smaller than the size of the wiring substrate WB. For example, the length of one side of the wiring substrate WB is about 8 mm to 15 mm, and a thickness thereof is set to about 0.2 mm to 0.6 mm. On the other hand, the length of one side of the semiconductor chip CHP is about 3 mm to 10 mm, and thickness thereof is set to about 0.05 mm to 0.4 mm.

Figure 2:
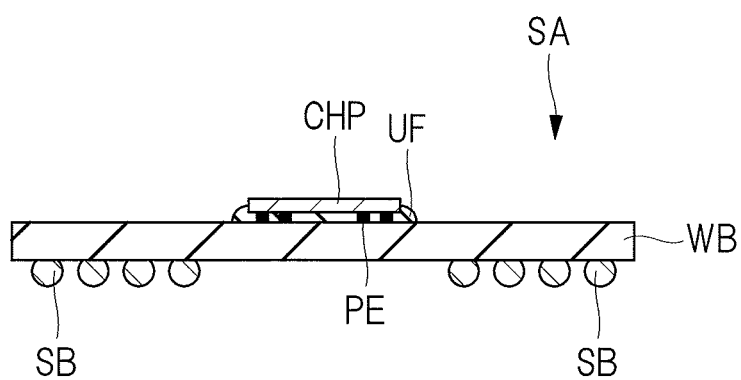
FIG. 2 is a side view of the semiconductor device according to the embodiment.

Next, FIG. 2 is a side view of the semiconductor device SA of the present embodiment. As shown in FIG. 2, the semiconductor device SA of the present embodiment has the wiring substrate WB, and a plurality of solder balls SB are formed on the rear surface (lower surface) of the wiring substrate WB. On the other hand, the semiconductor chip CHP is mounted on the front surface (upper surface) of the wiring substrate WB, and a plurality of pillar-shaped electrodes PE are formed on the semiconductor chip CHP. The height of these pillar-shaped electrodes PE is, for example, set to about 15 μm to 50 μm. And, by these pillar-shaped electrodes, the semiconductor chip CHP and the wiring substrate WB are electrically connected to each other. Note that, as shown in FIG. 2, the sealing material UF is filled in a gap between the semiconductor chip CHP and the wiring substrate WB, which is caused by the existence of the pillar-shaped electrodes PE.

Figure 3:
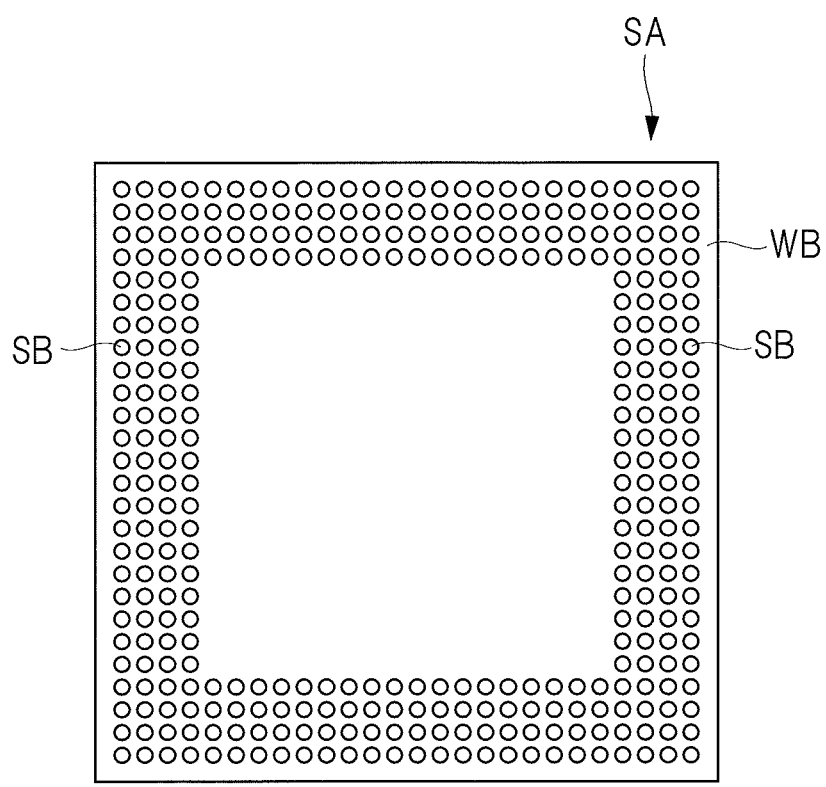
FIG. 3 is a bottom view of the semiconductor device according to the embodiment.

Subsequently, FIG. 3 is a bottom view of the semiconductor device SA according to the present embodiment. As shown in FIG. 3, the plurality of solder balls SB are arranged in an array pattern on the rear surface of the wiring substrate WB. For example, FIG. 3 shows an example in which the solder balls SB are arranged in four rows along the outer peripheral portion (outer edge portion) of the wiring substrate WB. The solder balls SB function as external connection terminals for use in connecting the semiconductor device SA to an external apparatus. That is, the solder balls SB are used when the semiconductor device SA is mounted on a circuit substrate represented by, for example, a motherboard.

Figure 4:
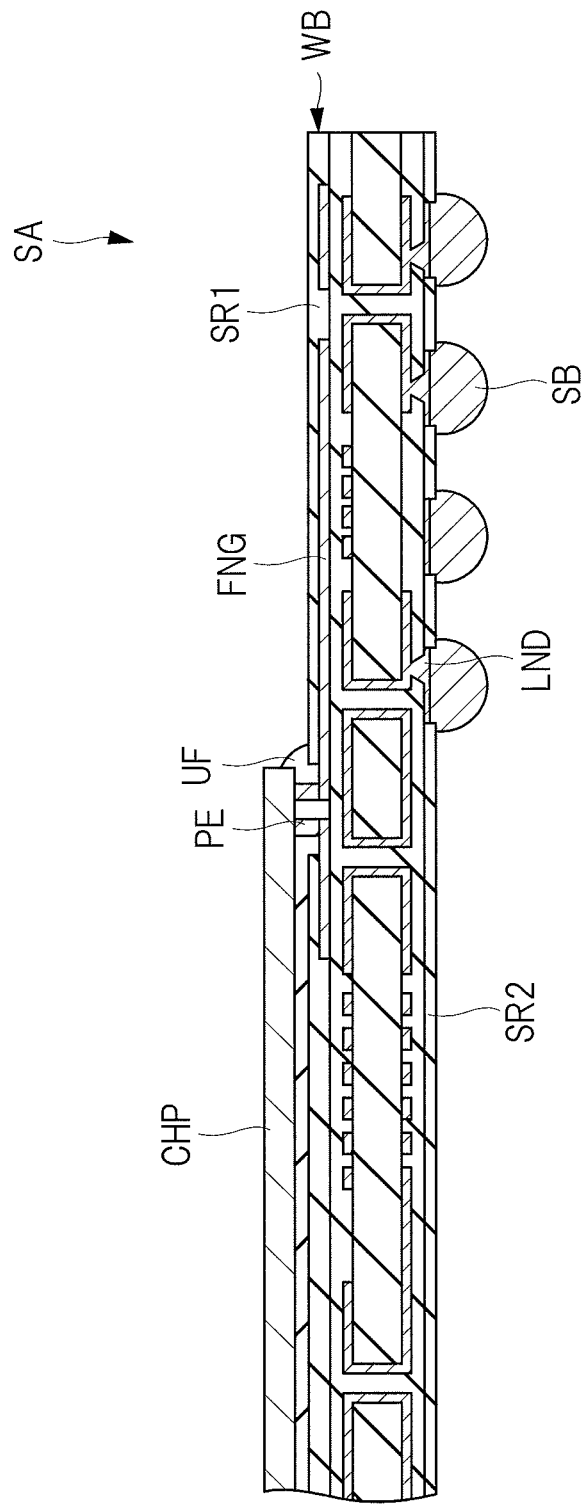
FIG. 4 is a partial cross-sectional view of the semiconductor device according to the embodiment.

FIG. 4 is a partial cross-sectional view of the semiconductor device SA of the present embodiment. As shown in FIG. 4, the wiring substrate WB has a multilayer wiring structure, and a solder resist SR2 is formed so as to cover the rear surface of the wiring substrate WB. Moreover, lands LND are formed so as to be exposed from the solder resist SR2, and the solder balls SB are mounted so as to be made in contact with these lands LND. The lands LND are connected to wirings formed inside the wiring substrate WB, and bonding fingers FNG are further formed on the front surface of the wiring substrate WB. Furthermore, while a part of the bonding fingers FNG is exposed from the solder resist SR1, the other part of the bonding fingers FNG is covered with the solder resist SR1.

The semiconductor chip CHP is mounted on the wiring substrate WB, and the pillar-shaped electrodes PE formed on the main surface of the semiconductor chip CHP are connected to the bonding fingers FNG exposed from the solder resist SR1. And, in the gap between the semiconductor chip CHP and the wiring substrate WB, the sealing material UF is filled. At this time, the semiconductor chip CHP is mounted on the front surface of the wiring substrate WB via the pillar-shaped electrodes PE so that the main surface of the semiconductor chip is faced to the front surface of the wiring substrate WB.

Figure 5:
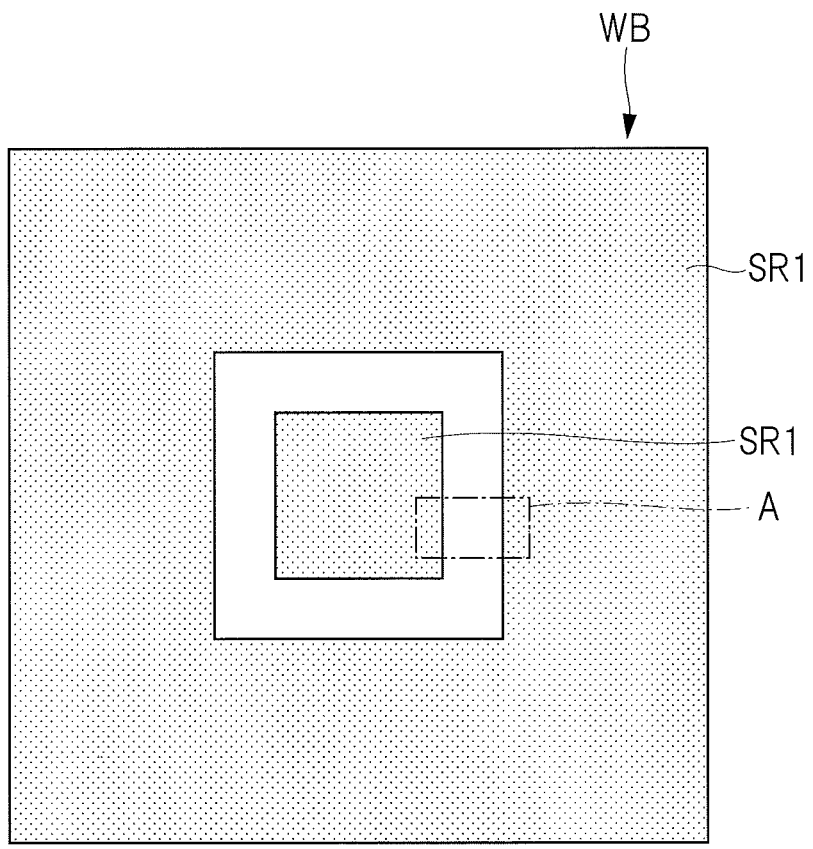
FIG. 5 is a plan view obtained when a wiring substrate is viewed from the top surface.

Next, FIG. 5 is a plan view showing the wiring substrate WB viewed from an upper surface. In FIG. 5, on the front surface of the rectangular-shaped wiring substrate WB, the solder resist SR1 is formed. For example, in FIG. 5, dots are attached to a region in which the solder resist SR1 is formed. More specifically, the solder resist SR1 is formed on the center portion and the peripheral portion of the wiring substrate WB, and a region with no solder resist SR1 formed thereon exists between the center portion and the peripheral portion.

Figure 6:
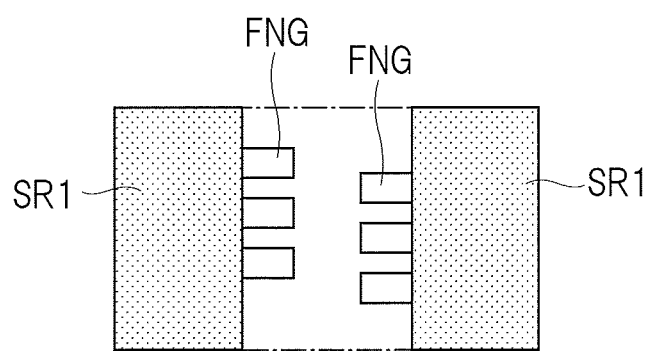
FIG. 6 is an enlarged view showing a partial region shown in FIG. 5 so as to be enlarged.

FIG. 6 is an enlarged view showing the region A shown in FIG. 5 so as to be enlarged. As shown in FIG. 6, a part of each of the plurality of bonding fingers FNG is exposed from a region that is not covered with the solder resist SR1. As shown in FIG. 6, the plurality of exposed bonding fingers FNG are arranged in, for example, a staggered pattern. Thus, to the part of each of these exposed bonding fingers FNG, the pillar-shaped electrode is electrically connected.

Figure 7:
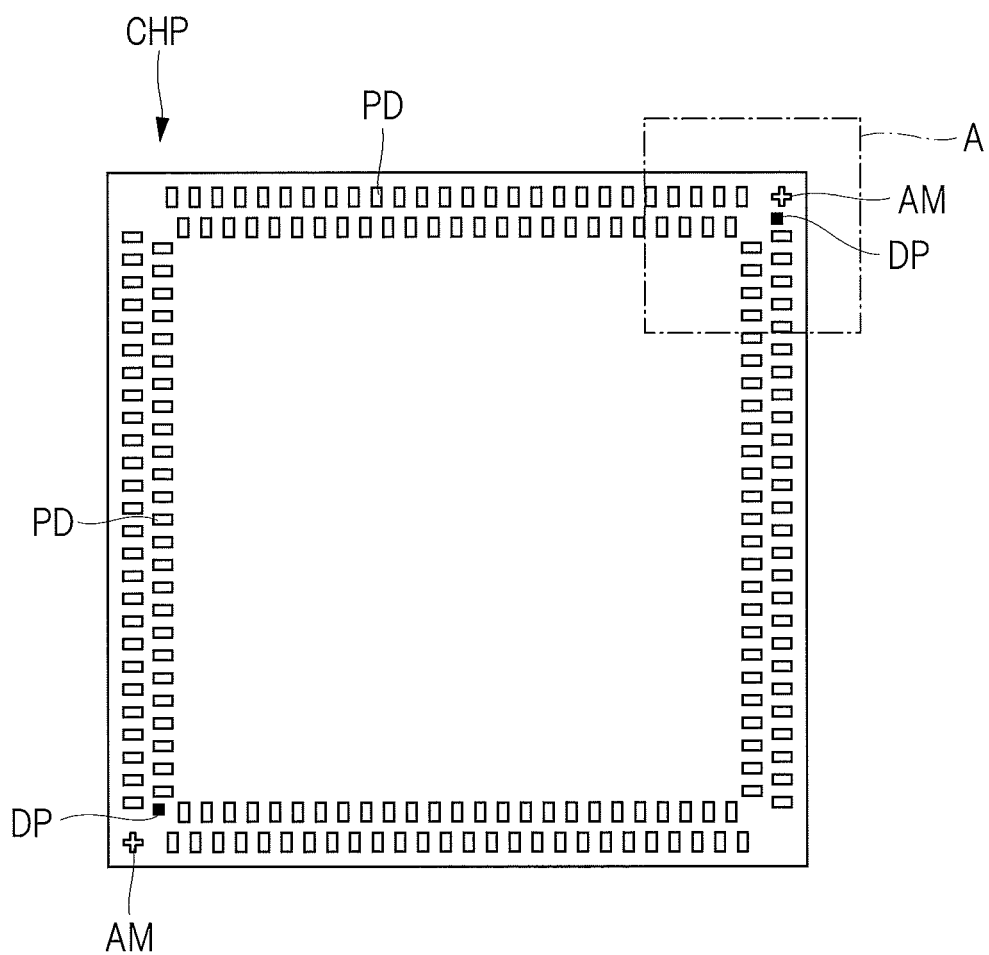
FIG. 7 is a plan view showing a semiconductor chip seen from the main surface side.

Subsequently, FIG. 7 is a plan view showing the semiconductor chip CHP viewed from the main surface side. As shown in FIG. 7, the semiconductor chip CHP in the present embodiment has a rectangular shape, and a plurality of pads PD are arranged along an end side of the semiconductor chip CHP on the main surface of the semiconductor chip CHP. More specifically, in FIG. 7, the plurality of pads PD are arranged so as to form a staggered arrangement of two rows along the end side of the semiconductor chip CHP. In this manner, in the present embodiment, explanations are made by exemplifying the staggered arrangement of two rows as one example of the layout pattern of the pads PD. However, the arrangement is not limited to this, the technical concept of the present embodiment can be also applied to, for example, a layout pattern in which a plurality of pads PD are arranged so as to be aligned in one row along the end side of the semiconductor chip CHP.

Note that, in FIG. 7, in the semiconductor chip CHP of the present embodiment, alignment marks AM or dummy pads DP for use in positioning alignment are formed at the two corner portions positioned on the diagonal line among four corners (corner portions). Details of a function of the dummy pad DP will be explained later in the method of manufacturing the semiconductor device.

<Pad Configuration in Related Technique>

Here, a structure of a pad PD will be explained by paying attention to one pad PD of the plurality of the pads PD formed on the semiconductor chip CHP shown in FIG. 7. First, a structure of the pad PD in the related technique will be explained with reference to the drawings.

Figure 8:
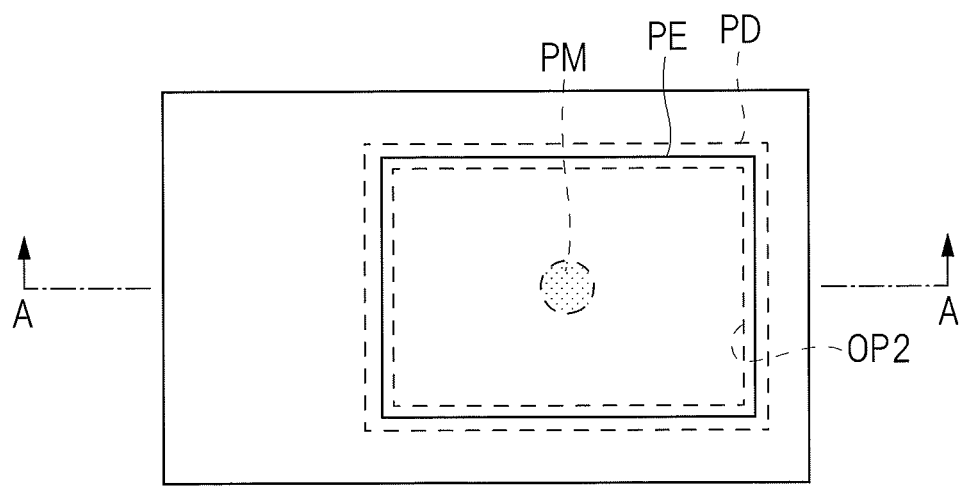
FIG. 8 is a plan view showing a structure of a pad according to a related technique.

FIG. 8 is a plan view showing the structure of the pad PD in the related technique. As shown in FIG. 8, the pad PD in the related technique has a rectangular shape, the pillar-shaped electrode PE is formed so as to be included in the pad PD when seen in a plan view, and an opening region OH2 is formed so as to be included in the pillar-shaped electrode PE. At this time, in the related technique, the center position of the pad PD, the center position of the pillar-shaped electrode PE and the center position of the opening region OP2 are coincident with one another. And, when seen in a plan view, a probe mark PM is formed in a region of the surface region of the pad PD which is overlapped with the opening region OP2. This probe mark PM is a mark generated by pressing a probe needle onto the pad PD in an electrical characteristic inspection.

Figure 9:
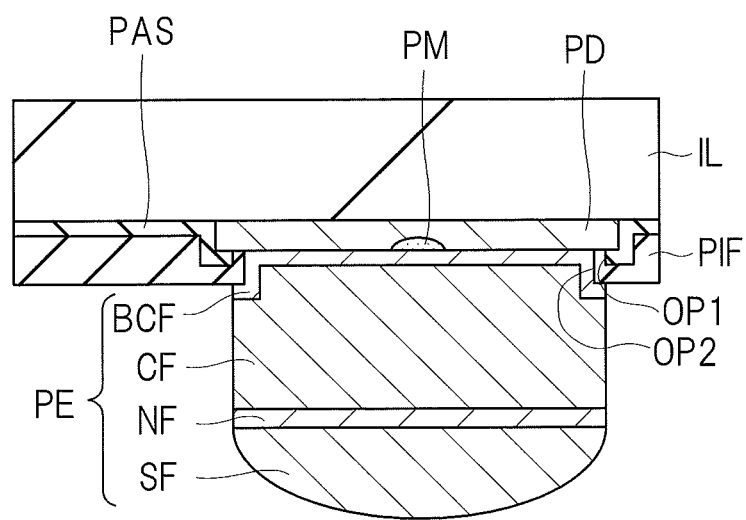
FIG. 9 is a cross-sectional view taken along a line A-A of FIG. 8.

FIG. 9 is a cross-sectional view cut along a line A-A of FIG. 8. FIG. 9 shows a state in which the main surface of the semiconductor chip is faced downward. In FIG. 9, the pad PD is formed so as to be made in contact with an interlayer insulating film IL formed on the main surface side of the semiconductor chip, and a surface protective film PAS is formed so as to cover the pad PD. An opening region OP1 is formed on the surface protective film PAS, and the surface region of the pad PD is exposed from the opening region OP1. Moreover, a protective insulating film PIF is formed so as to cover the surface protective film PAS with the opening region OP1 formed therein, and an opening region OP2 is formed on the protective insulating film PIF. The surface region of the pad PD is exposed from the opening region OP2. At this time, the size of the opening region OP2 formed on the protective insulating film PIF is made smaller than the size of the opening region OP1 formed on the surface protective film PAS. Note that the probe mark PM is formed on the surface region of the pad PD.

Subsequently, the pillar-shaped electrode PE is formed so as to bury the opening region OP2 formed on the protective insulating film PIF, and also to be made in contact with the pad PD. The pillar-shaped electrode PE is configured by, for example, a barrier conductor film BCF that is made in contact with the surface region of the pad PD from the inner wall of the opening region OP2, a copper film CF that is made in contact with the barrier conductor film BCF, a nickel film NF that is made in contact with the copper film CF and a solder film SF that is made in contact with the nickel film NF.

In the study about the pad structure in the related technique configured as described above by the present inventors, it has been found that the pad structure of the related technique is a structure in which peeling off easily occurs at the joint interface between the pillar-shaped electrode PE and the pad PD of the semiconductor chip, and that the related technique has a margin for improvement from the viewpoint of improving the connection reliability between the pad PD and the pillar-shaped electrode PE. Therefore, the margin for improvement included in the related technique will be explained below.

<Margin for Improvement>

Figure 10:
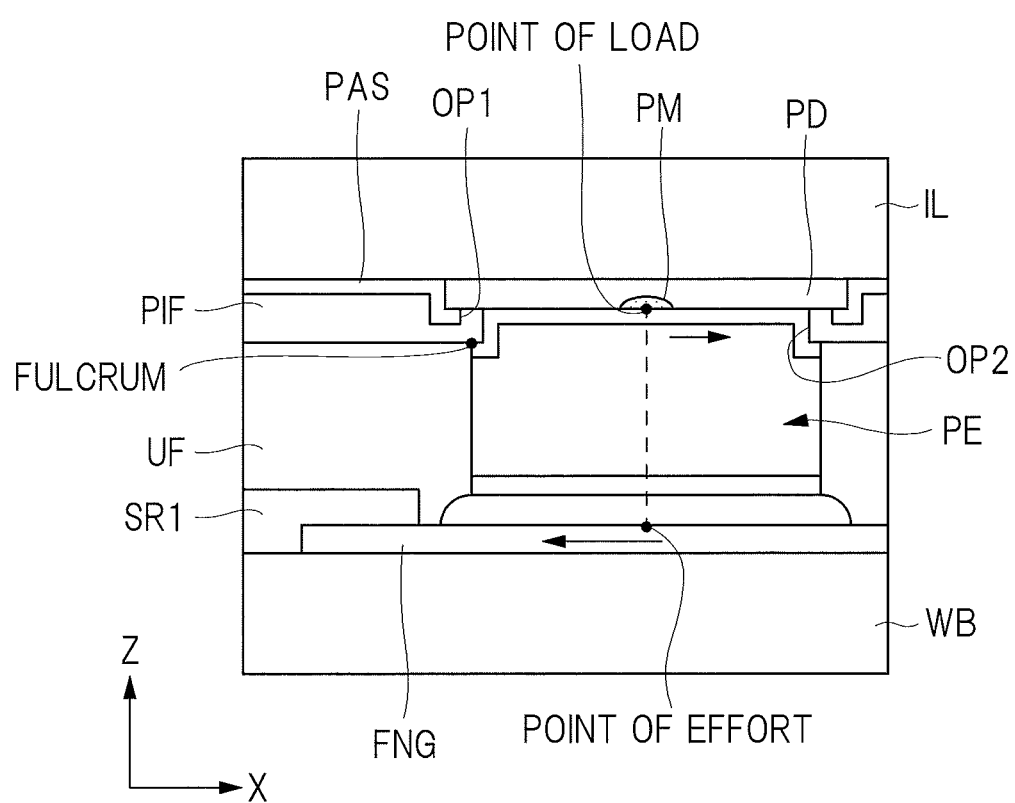
FIG. 10 is a view for use in explaining a margin for improvement included in the related technique.

For example, a pad structure as shown in FIG. 9 is formed in the semiconductor chip in the related technique, and a wiring substrate and a semiconductor chip are connected to each other by this pad structure. More specifically, FIG. 10 is a schematic view showing a structure in which pads PD formed on the semiconductor chip and bonding fingers FNG formed on the wiring substrate WB are connected to each other via pillar-shaped electrodes PE by using the pad structure shown in FIG. 9. As shown in FIG. 10, it is found that the pad PD and the bonding finger FNG are connected to each other via the pillar-shaped electrode PE by connecting the solder film of the pillar-shaped electrode PE to a portion exposed from the solder resist SR1 in the bonding finger FNG formed on the wiring substrate WB.

As described above, the semiconductor device having a mounting mode in which the semiconductor chip with the pillar-shaped electrodes PE formed thereon is mounted on the wiring substrate WB having the bonding fingers FNG is obtained. However, when a heat load is applied onto this semiconductor device through a temperature cycle test or others, there is a tendency of occurrence of the peeling off at the joining interface between the pillar-shaped electrodes PE and the pads PD of the semiconductor chip. More particularly, when the joining area between the pads PD and the pillar-shaped electrodes PE becomes smaller as the pitch interval of the pads PD becomes narrower, the joining strength per the pillar electrode PE is lower, and therefore, a possibility of the peeling off is increased. Moreover, when at least a part of the multilayer wiring layer formed on the semiconductor chip is formed by a low dielectric-constant film (for example, porous film) having a dielectric constant lower than that of the oxide silicon film, the peeling off more easily occurs on particularly a portion of the low dielectric-constant film positioned below the pillar-shaped electrode PE.

A main mechanism by which the peeling off occurs at the joining interface between the pads PD and the pillar-shaped electrodes PE will be explained below. For example, a material for the wiring substrate WB, the sealing material or others has a higher linear expansion coefficient than that of the semiconductor chip. For this reason, when the heating and the cooling due to the heat load such as the temperature cycle test or others are repeated, a repetitive stress is exerted onto the joining portion (joining region, that is, bonding region) between the pillar-shaped electrodes PE and the pads PD, which is interposed between the bonding fingers FNG and the pads PD.

At this time, as shown in FIG. 10, in the related technique, a probe mark PM is formed within the surface region of the pad PD exposed from the opening region OP2. Since this probe mark PM is a mark formed when a probe needle is pressed onto the pad PD, the asperity (surface roughness) of the surface region of the pad PD with the probe mark formed thereon is considered to become large. Moreover, when the probe mark PM is formed within the surface region of the pad PD exposed from the opening region OP2, the possibility of decrease in the strength of the joining interface becomes high due to development residue caused when the opening region OP2 is formed or voids caused in the vicinity of the joining interface when the pillar-shaped electrode PE is formed. Therefore, it is considered that the peeling off more easily occurs at the joining interface between the pads PD and the pillar-shaped electrodes PE due to the probe mark PM (first factor).

Moreover, for example, a stressed portion applied onto the joining portion between the pillar-shaped electrode PE and the bonding finger FNG can be simply shown as a point of effort (application) without being regarded as a plane, similarly, a stressed portion applied onto the joining portion between the pillar-shaped electrode PE and the pad PD can be shown as a point of load, and the end portion of the joining portion between the pillar electrode PE and the protective insulating film PIF can be shown as a fulcrum, as shown in FIG. 10.

That is, in the pad structure in the related technique shown in FIGS. 8 and 9, the pillar-shaped electrode PE having almost the same size as that of the opening region OP2 when seen in a plan view is adopted in order to prevent the pillar-shaped electrodes PE formed on the respective adjacent pads PD from being in contact with each other. As a result, the center position of the opening region OP2 and the center position of the pillar-shaped electrode PE tends to be coincident with each other, and therefore, an X-coordinate position of the point of effort and an X-coordinate position of the point of load are coincident with each other as shown in FIG. 10. In this manner, in the pad structure in the related technique, the X-coordinate of the point of effort and the X-coordinate of the point of load are coincident with each other. In this case, a magnitude of the repetitive stress applied onto the point of load is increased. Therefore, in the pad structure in the related technique shown in FIGS. 8 and 9, a large stress is applied onto the joining portion between the pillar electrode PE and the pad PD, and therefore, the peeling off easily occurs at the joining interface between the pad PD and the pillar-shaped electrode PE (second factor).

From the above-described matter, in the pad structure of the related technique, it is considered that the peeling off tends to occur at the joining interface between the pad PD and the pillar-shaped electrode PE because of the above-described first factor and second factor. This means the reduction in the reliability of the semiconductor device in the related technique, and therefore, it is considered that the related technique has the margin for improvement from the viewpoint of suppressing the reduction in the reliability of the semiconductor device.

Here, when attention is paid to the first factor caused by the probe mark PM, for example, as the result that a probe needle is pressed onto the pad PD in an electrical characteristic inspection, the probe mark PM is formed on the surface of the pad PD. For this reason, it can be considered that, if the electrical characteristic inspection is performed without directly pressing the probe needle onto the pad PD, no probe mark PM is formed on the pad PD, and therefore, the first factor caused by the probe mark PM can be eliminated. More specifically, if, after the pillar-shaped electrode PE is formed on the pad PD, the electrical characteristic inspection is performed without directly pressing the probe needle onto the pillar-shaped electrode PE, the probe needle is not directly made in contact with the pad PD, and therefore, it can be considered that the formation of the probe mark PM on the surface region of the pad PD is prevented.

However, in the case when the electrical characteristic inspection is performed by directly pressing the probe needle onto the pillar-shaped electrode PE, there is a larger risk of degradation of the accuracy of the electrical characteristic inspection than the case when the electrical characteristic inspection is performed by directly pressing the probe needle onto the pad PD because a resistance component of the pillar-shaped electrode PE is added to a parasitic resistance or others. Moreover, as the result that the probe needle is pressed onto the tip end of the pillar-shaped electrode PE, a concave portion is formed on the tip end of the pillar-shaped electrode PE, and therefore, there is a risk of reduction in the connection reliability between the pillar-shaped electrode PE and the bonding finger FNG. Therefore, from the viewpoint of improving the accuracy of the electrical characteristic inspection and the viewpoint of improving the connection reliability between the pillar-shaped electrode PE and the bonding finger FNG, it is desired to perform the electrical characteristic inspection by directly pressing the probe needle onto the pad PD rather than the electrical characteristic inspection by directly pressing the probe needle onto the pillar-shaped electrode PE. On the other hand, in this case, the peeling off tends to occur at the joining interface between the pad PD and the pillar-shaped electrode PE due to the first factor caused by the probe mark PM formed on the pad PD.

Moreover, in the pad structure of the related technique, also from the viewpoint that the pillar-shaped electrode PE having almost the same size as that of the opening region OP2 when seen in a plan view is adopted (from the viewpoint of the second factor), it is required to consider that the peeling off tends to occur at the joining interface between the pad PD and the pillar-shaped electrode PE.

From the above-described manner, in order to improve the resistance of the semiconductor against the heat load caused by the temperature cycle test or others, it is required to adopt a pad structure in which the joining interface between the pad PD and the pillar-shaped electrode PE is difficult to be broken by a stress.

Therefore, the present embodiment provides a device for suppressing the peeling off at the joining interface between the pad PD and the pillar-shaped electrode PE caused by the above-described first factor and second factor. A technical concept of the embodiment to which this device is applied will be explained below.

<Pad Structure in the Embodiment>

Figure 11:
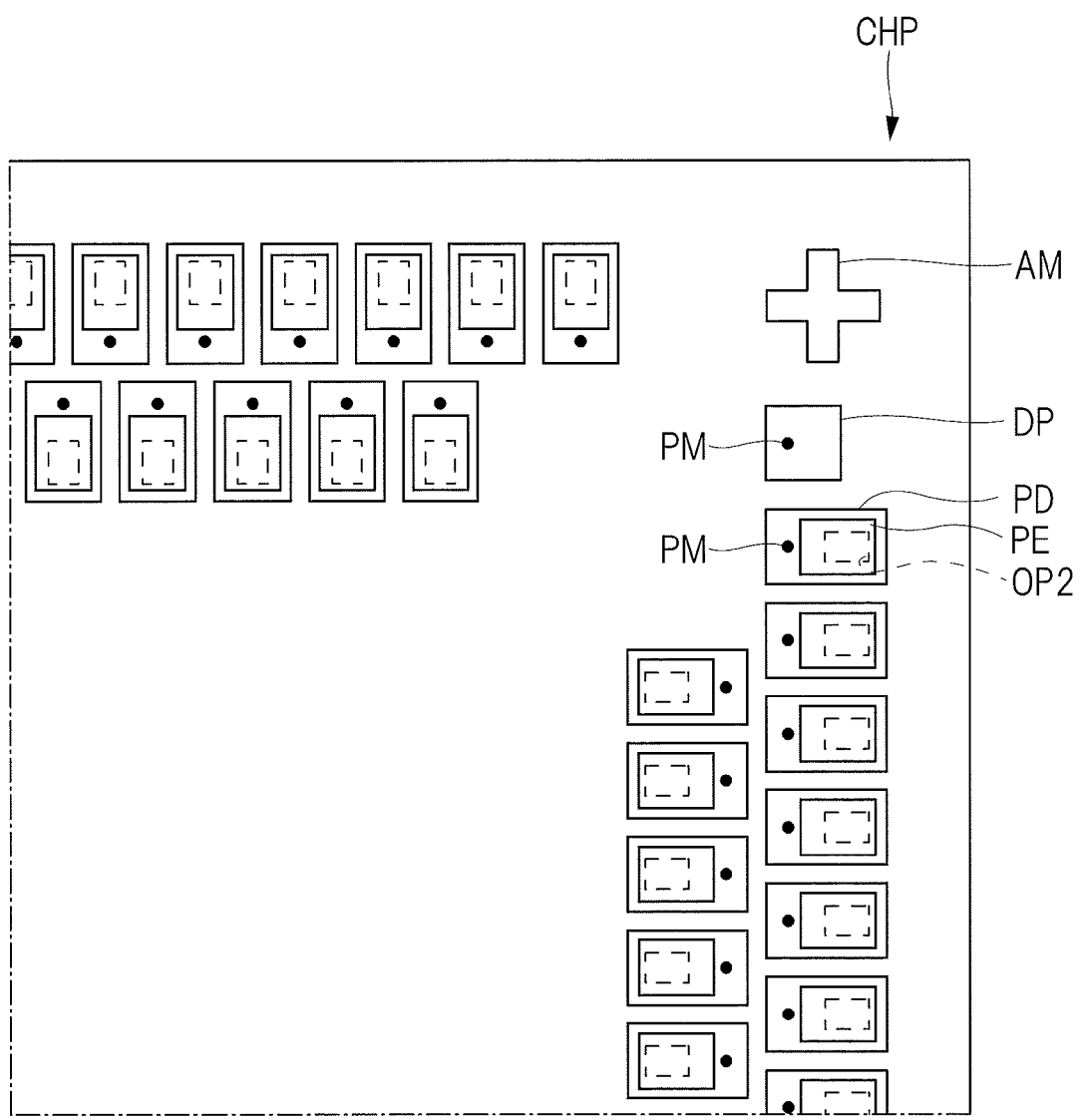
FIG. 11 is a plan view showing a part of the semiconductor chip according to the embodiment so as to be enlarged.

FIG. 11 is a plan view showing a part of the semiconductor chip CHP in the present embodiment so as to be enlarged. In FIG. 11, a plurality of pads PD are arranged along an end side of the semiconductor chip CHP. More particularly in FIG. 11, the plurality of pads PD are arranged along the end side of the semiconductor chip CHP so as to form a staggered arrangement of two rows. Moreover, as shown in FIG. 11, a probe mark PM is formed on each of the plurality of pads PD, and the pillar-shaped electrode PE is formed so as to bury the opening region OP2. Further, in FIG. 11, when attention is paid to a corner (corner portion) of the semiconductor chip CHP, it is found that a dummy pad DP and an alignment mark AM are formed in the vicinity of the corner portion of the semiconductor chip CHP.

Next, the structure of the pads PD of the present embodiment will be explained as paying attention to one pad PD among the plurality of pads PD formed on the semiconductor chip CHP.

Figure 12:
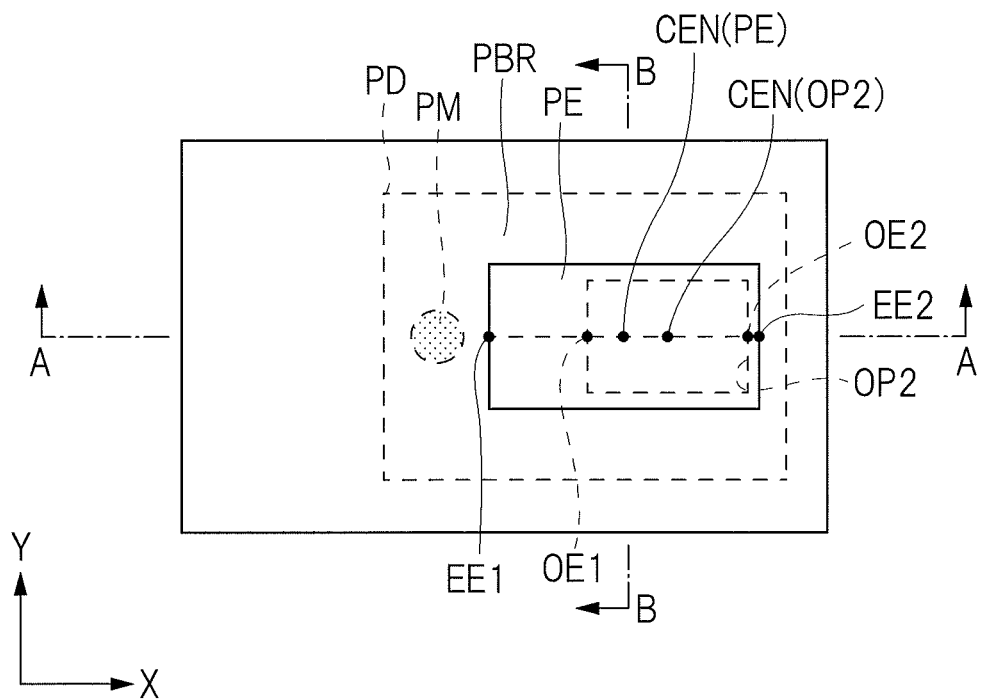
FIG. 12 is a plan view showing a structure of a pad according to the embodiment.

FIG. 12 is a plan view showing a structure of the pad PD according to the present embodiment. As shown in FIG. 12, the pad PD of the present embodiment has a rectangular shape, the pillar-shaped electrode PE is formed so as to be included in the pad PD when seen in a plan view, and the opening region OP2 is formed so as to be included in the pillar-shaped electrode PE. Moreover, the probe mark PM is formed in a probe region PBR not overlapped with the opening region OP2 when seen in a plan view in the front region of the pad PD. The probe mark PM is a mark generated by pressing a probe needle onto the pad PD in an electrical characteristic inspection. In this manner, the pad PD according to the present embodiment has a rectangular shape, and the opening region OP2 and the probe mark PM are formed so as to be aligned in the long side direction of the pad PD.

Here, in FIG. 12, the probe region PBR is defined as a region other than the opening region OP2 in the surface region of the pad PD. More particularly, in FIG. 12, the probe mark PM is formed in a region that is not overlapped with the pillar-shaped electrode PE in the probe region PBR when seen in a plan view.

Note that, for example, the length of the pad PD in the short side direction is about 54 μm, and the length of the pad PD in the long side direction is about 84.5 μm. Moreover, the length of the pillar-shaped electrode PE in the short side direction is about 30 μm, and the length of the pillar-shaped electrode PE in the long side direction is about 51 μm. Furthermore, the length of the opening region OP2 in the short side direction is about 20 μm, and the length of the opening region OP2 in the long side direction is about 30 μm.

Figure 13:
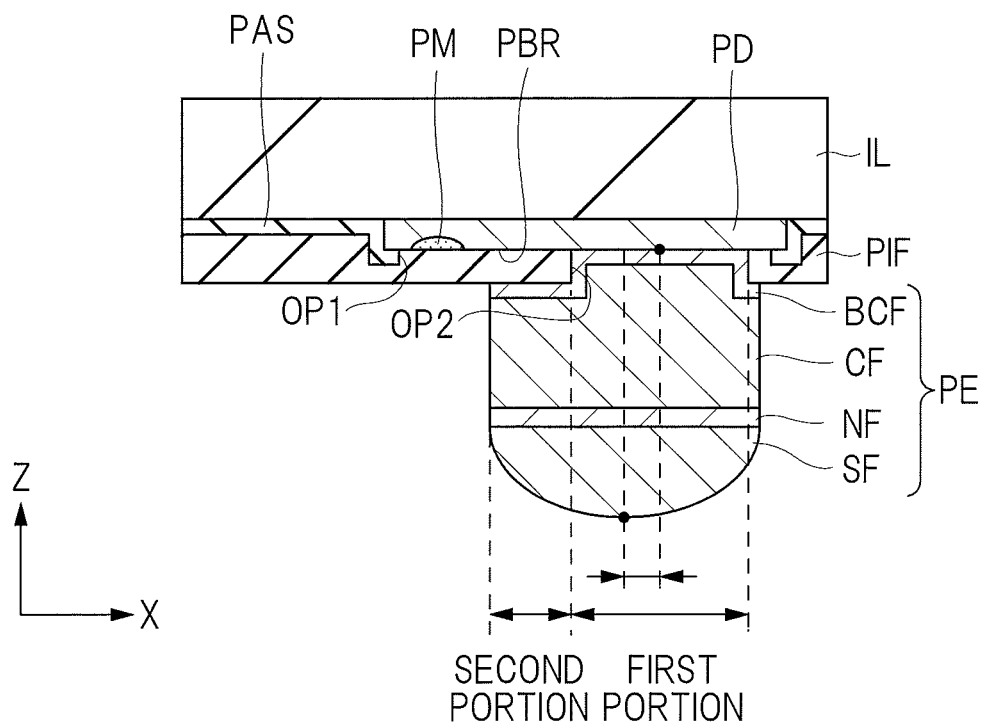
FIG. 13 is a cross-sectional view cut along a line A-A of FIG. 12.

Subsequently, FIG. 13 is a cross-sectional view cut along a line A-A of FIG. 12. FIG. 13 shows a state in which the main surface of the semiconductor chip is faced downward. In FIG. 13, the pad PD is formed so as to be made in contact with an interlayer insulating film IL formed on the main surface side of the semiconductor chip, and a surface protective film PAS is formed so as to cover the pad PD. An opening region OP1 is formed on the surface protective film PAS, and the surface region of the pad PD is exposed from the opening region OP1.

Moreover, a protective insulating film PIF is formed so as to cover the surface protective film PAS with the opening region OP1 formed therein, and an opening region OP2 is formed on the protective insulating film PIF. From the opening region OP2, the surface region of the pad PD is exposed. At this time, the size of the opening region OP2 formed on the protective insulating film PIF is made smaller than the size of the opening region OP1 formed on the surface protective film PAS.

Note that, in FIG. 13, a probe mark PM is formed in the probe region PBR. The probe region PBR is defined as a region other than the opening region OP2 in the surface region of the pad PD with reference to FIG. 12. However, when this is defined in more detail with reference to FIG. 13, the probe region PBR can be defined as a region other than the opening region OP2, the region also being the surface region of the pad PD which is exposed when the protective insulating film PIF is removed. That is, in the definition with reference to FIG. 12, the region covered with the surface protective film PAS in the surface region of the pad PD is also regarded as the probe region PBR. However, practically, the electrical characteristic inspection is performed by pressing a probe needle into the opening region OP1 exposed from the surface protective film PAS. For this reason, with reference to FIG. 13, more precisely, the probe region PBR is defined correctly as a region other than the opening region OP2, the region also being the surface region of the pad PD which is exposed when the protective insulating film PIF is removed.

Subsequently, in the pad structure according to the present embodiment, a pillar-shaped electrode PE is formed so as to bury the opening region OP2 formed on the protective insulating film PIF, and also to be made in contact with the pad PD. This pillar-shaped electrode PE is configured by, for example, a barrier conductor film BCF that is made in contact with the surface region of the pad PD from the inner wall of the opening region OP2, a copper film CF in contact with the barrier conductor film BCF, a nickel film NF in contact with the copper film CF and a solder film SF in contact with the nickel film NF. The barrier conductor film BCF is formed so as to contain, for example, any one of a titanium nitride film (TiN film), a titanium film (Ti film) and a titanium tungsten film (TiW film).

Note that, by these, the pillar-shaped electrode PE is not limited to this configuration, and may be configured by, for example, the barrier conductor film BCF, the copper film CF in contact with the barrier conductor film BCF and the solder film SF in contact with the copper film CF, without containing the nickel film NF as the component.

Figure 14:
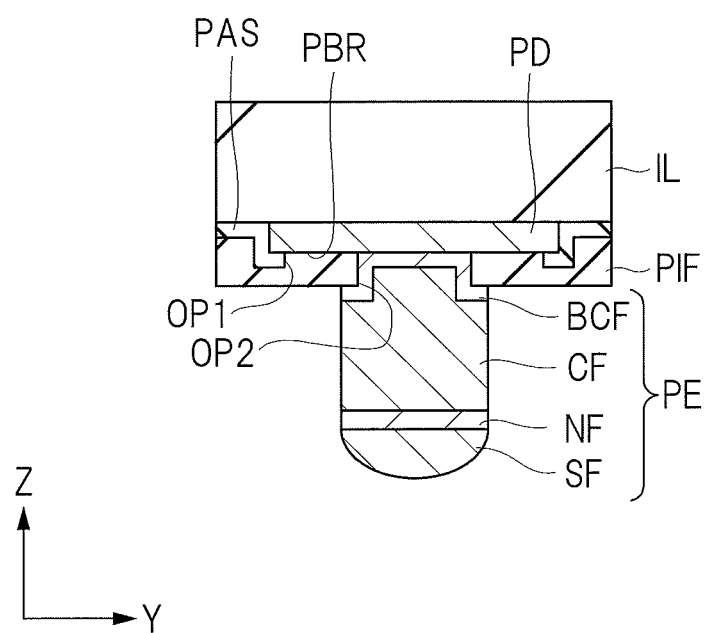
FIG. 14 is a cross-sectional view cut along a line B-B of FIG. 12.

Next, FIG. 14 is a cross-sectional view cut along a line B-B of FIG. 12. As shown in FIG. 14, the pad PD is formed so as to be made in contact with an interlayer insulating film IL formed on the main surface side of the semiconductor chip, and a surface protective film PAS is formed so as to cover the pad PD. An opening region OP1 is formed on the surface protective film PAS, and the surface region of the pad PD is exposed from the opening region OP1. Moreover, a protective insulating film PIF is formed so as to cover the surface protective film PAS with the opening region OP1 formed therein, and an opening region OP2 is formed on the protective insulating film PIF. From the opening region OP2, the surface region of the pad PD is exposed. At this time, the size of the opening region OP2 formed on the protective insulating film PIF is made smaller than the size of the opening region OP1 formed on the surface protective film PAS. And, in the pad structure in the present embodiment, the pillar-shaped electrode PE is formed so as to bury the opening region OP2 formed on the protective insulating film PIF, and also so as to be made in contact with the pad PD.

Figure 15:
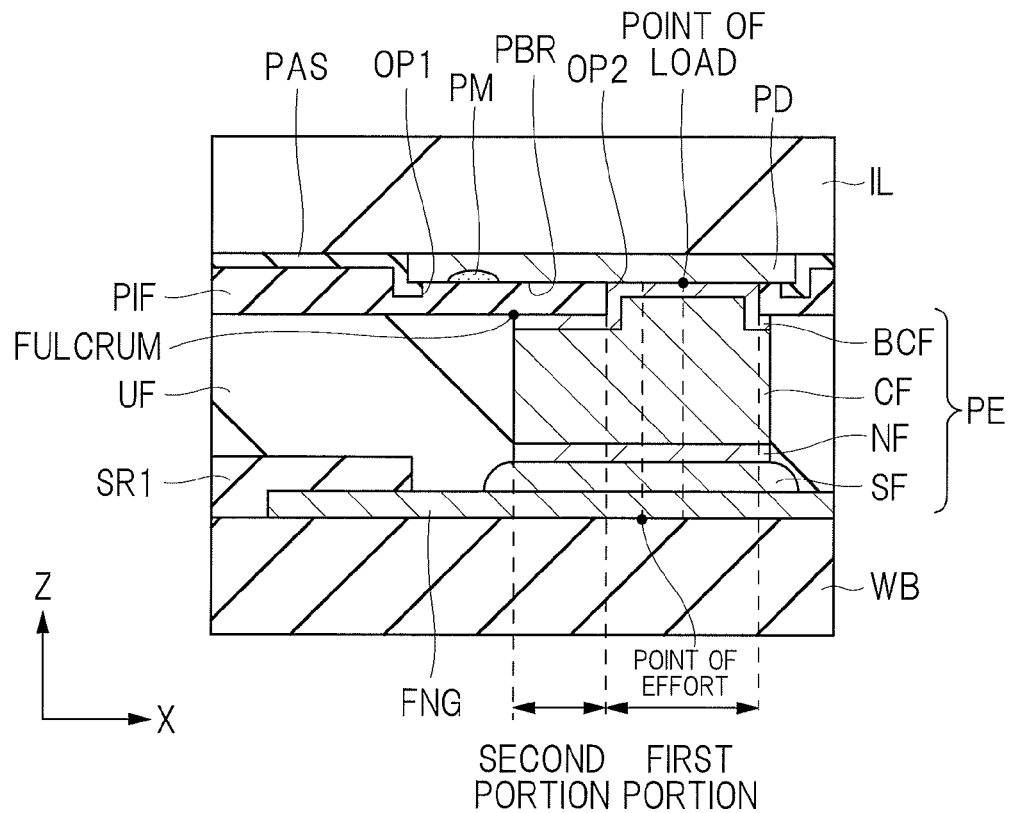
FIG. 15 is a schematic view showing a configuration in which a pad formed on the semiconductor chip by using the structure of the pad shown in FIG. 13 and a bonding finger formed on the wiring substrate are connected with each other via the pillar-shaped electrode.

The pad structure as shown in FIG. 13 and FIG. 14 is formed in the semiconductor chip according to the present embodiment, and the wiring substrate and the semiconductor chip are connected with each other by this pad structure. More specifically, FIG. 15 is a schematic view showing a configuration in which the pad PD formed on the semiconductor chip and the bonding finger FNG formed on the wiring substrate WB are connected with each other via the pillar-shaped electrode PE by using the pad structure shown in FIG. 13. As shown in FIG. 15, it is found that the pad PD and the bonding finger FNG are connected with each other via the pillar-shaped electrode PE by connecting the solder film SF of the pillar-shaped electrode PE to a portion exposed from the solder resist SR1 in the bonding finger FNG formed on the wiring substrate WB. Moreover, a sealing material UF is filled into a gap between the semiconductor chip and the wiring substrate WB caused by the pillar-shaped electrode PE.

Figure 16:
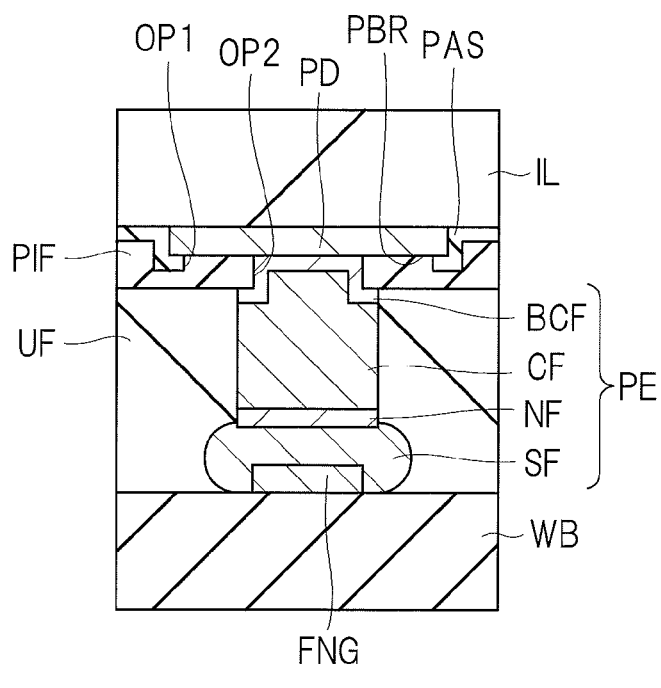
FIG. 16 is a schematic view showing a configuration in which a pad formed on the semiconductor chip by using the structure of the pad shown in FIG. 13 and a bonding finger formed on the wiring substrate are connected with each other via the pillar-shaped electrode.

Similarly, FIG. 16 is a schematic view showing a configuration in which the pad PD formed on the semiconductor chip and the bonding finger FNG formed on the wiring substrate WB are connected with each other via the pillar-shaped electrode PE by using the pad structure shown in FIG. 14. As shown in FIG. 16, it is found that the pad PD and the bonding finger FNG are connected with each other via the pillar-shaped electrode PE by connecting the solder film SF of the pillar-shaped electrode PE to a portion exposed from the solder resist SR1 in the bonding finger FNG formed on the wiring substrate WB. And, a sealing material UF is filled into a gap between the semiconductor chip and the wiring substrate WB caused by the pillar-shaped electrode PE. From the above-described manner, the semiconductor device according to the present embodiment includes: the wiring substrate WB having the front surface (first surface) and the bonding finger FNG formed on the front surface; and the semiconductor chip having a main surface, the pad PD formed on the main surface, the protective insulating film PIF formed on the pad PD and the pillar-shaped electrode PE that is formed on the opening region OP2 of the pad PD and exposed from the protective insulating film PIF.

<Feature of Embodiment>

Subsequently, with reference to drawings, feature points of the present embodiment will be explained. For example, as shown in FIGS. 12 and 13, the first feature point in the present embodiment lies in that the probe mark PM is formed on the probe region PBR that is not overlapped with the opening region OP2. More particularly, in the present embodiment, the probe mark PM is formed at a position that is neither overlapped with the opening region OP2 nor overlapped with the pillar-shaped electrode PE when seen in a plan view.

Thus, according to the present embodiment, since no probe mark PM is formed on the surface region of the pad PD exposed from the opening region OP2, the peeling off at the joining interface between the pad PD and the pillar-shaped electrode PE due to the probe mark PM can be suppressed.

For example, in the related technique, as shown in FIG. 10, the probe mark PM is formed in the surface region of the pad PD exposed from the opening region OP2. This means that the probe mark PM exists at the joining interface between the pad PD and the pillar-shaped electrode PE in the related technique. As a result, it is considered that an adhesion property at the joining interface between the pad PD and the pillar-shaped electrode PE is reduced by increase in the surface roughness due to the probe mark PM, development residue caused when the opening region OP2 is formed, and voids caused in the vicinity of the joining interface when the pillar-shaped electrode PE is formed. Therefore, in the pad structure of the related technique in which the probe mark PM is formed in the surface region of the pad PD exposed from the opening region OP2, the peeling off tends to occur at the joining interface between the pad PD and the pillar-shaped electrode PE.

On the other hand, in the present embodiment, as shown in FIG. 12 and FIG. 13, the probe mark PM is formed on the probe region PBR that is not overlapped with the opening region OP2. In other words, in the pad structure according to the present embodiment, no probe mark PM exists at the joining interface between the pad PD and the pillar-shaped electrode PE. From the above-described manner, according to the present embodiment, the adhesion property at the joining interface between the pad PD and the pillar-shaped electrode PE is not influenced by the probe mark. Therefore, according to the present embodiment in which no probe mark PM is formed in the surface region of the pad PD that is exposed from the opening region OP2, the peeling off at the joining interface between the pad PD and the pillar-shaped electrode PE caused by the probe mark PM can be effectively suppressed. Moreover, according to the present embodiment, since the adhesion property at the joining interface between the pad PD and the pillar-shaped electrode PE is not influenced by the probe mark PM, the limitation of the number of contacts of the probe needle can be moderated.

The second feature point in the present embodiment lies in that, for example, as shown in FIG. 12, a profile size (plane size) of the pillar-shaped electrode PE is made to be significantly larger than a profile size (plane size) of the opening region OP2. That is, in the second feature point of the present embodiment, particularly a length of a side of the pillar-shaped electrode PE that is in parallel with the long side of the pad PD among the sides of the pillar-shaped electrode PE having a square shape in its plane shape is made to be significantly larger than the side of the opening region OP2 that is in parallel with the long side of the pad PD. That is, as shown in FIG. 13, in the pillar-shaped electrode PE having a first portion formed on the pad opening region OP2 and a second portion that is extended over the probe region from the opening region OP2, the second portion which is formed so as to be in contact with the protective insulating film PIF is expanded so as to come close to the portion with the probe mark PM formed in the probe region PBR.

In this manner, the pillar-shaped electrode PE of the present embodiment can be made in contact with the surface region of the pad PD exposed from the opening region OP2 by the first portion, and can increase the region that is in contact with the protective insulating film PIF by the second portion. That is, the joining strength between the pillar-shaped electrode PE and the protective insulating film PIF is increased by the increase in the area of the contact surface between the barrier conductor film BCF of the pillar-shaped electrode PE and the protective insulating film PIF by extending the second portion of the pillar-shaped electrode PE toward the probe mark PM. In this manner, the joining strength can be supported at the joining portion between the pad PD and the pillar-shaped electrode PE. As a result, the peeling off at the joining interface between the pad PD and the pillar-shaped electrode PE can be suppressed.

In the present embodiment, among a plurality of electrode ends of the pillar-shaped electrode PE, a gap between one electrode end of the pillar-shaped electrode PE which is the closest to the probe mark PM and an opening end of the opening region OP2 on the same side as the one electrode end of the pillar-shaped electrode PE is made wider than each of gap between other electrode end of the pillar-shaped electrodes PE and an opening end of the opening region OP2 on the same side as the other electrode end of the pillar-shaped electrodes PE. More specifically, as shown in FIG. 12, for example, on a straight line passing through a center position CEN (PEN) of the pillar-shaped electrode PE and a center position CEN (OP2) of the opening region OP2 along the X direction, a gap from an electrode end EE1 of the pillar-shaped electrode PE to an opening end E1 of the opening region OP2 is made wider than a gap from an electrode end EE2 of the pillar-shaped electrode PE opposed to the electrode end EE1 of the pillar-shaped electrode PE to the opening end OE2 of the opening region OP2.

From the above-described manner, according to the pillar-shaped electrode PE of the present embodiment, the area of the joining portion between the barrier conductor film BCF of the pillar-shaped electrode PE and the protective insulating film PIF can be sufficiently ensured, and therefore, the peeling off at the joining interface between the pad PD and the pillar-shaped electrode PE can be suppressed. Moreover, in the present embodiment, the plane size of the pillar-shaped electrode PE is made wider than the plane size of the opening region OP2, and therefore, the area of the joining portion between the pillar-shaped electrode PE and the bonding finger FNG formed on the wiring substrate WB is increased, so that the strength of the joining portion between the pillar-shaped electrode PE and the bonding finger FNG is also increased, and the peeling off caused at the joining interface between the bonding finger FNG and the pillar-shaped electrode can be prevented.

Note that, in the related technique, as shown in FIG. 10, the center position of the pillar-shaped electrode PE is coincident with the center position of the opening region OP2. However, in the present embodiment, as shown in FIG. 13, the center position of the pillar-shaped electrode PE is not coincident with the center position of the opening region OP2.

More specifically, in FIGS. 13 and 15, the X-coordinate of the center position of the opening region OP2 is shifted from the X-coordinate of the center position of the pillar-shaped electrode PE that is opposed to the bonding finger FNG. In another viewpoint, as shown in FIG. 12, it can be also said that the positional shift between the center position of the pillar-shaped electrode PE and the center position of the opening region OP2 is caused in the long side direction of the pad PD. This means that, according to the pad structure of the present embodiment, the X-coordinate of the point of effort and the X-coordinate of the point of load are shifted from each other by the positional shift between the center position of the opening region OP2 and the center position of the pillar-shaped electrode PE when a stress caused based on a heat load is applied. As a result, in the pad structure in the present embodiment, a magnitude of the repetitive stress applied onto the point of load becomes small. Therefore, in the pad structure in the present embodiment, the magnitude of the stress applied onto the joining portion of the pillar-shaped electrode PE with the pad PD can be small, so that the peeling off at the joining interface between the pad PD and the pillar-shaped electrode PE can be suppressed.

That is, the materials for the wiring substrate WB, the sealing material and others have a larger linear expansion coefficient than that of the semiconductor chip. From this manner, a repetitive stress is applied onto the joining portion between the pad PD and the pillar shaped electrode PE that is interposed between the pad PD and the bonding finger FNG by the repetitive heating and cooling caused by the heat load by the temperature cycle test or others. At this time, for example, in the pad structure of the related technique shown in FIG. 9, the X-coordinate of the point of effort and the X-coordinate of the point of load are coincident with each other as shown in FIG. 10 because of the fact that the center position of the opening region OP2 and the center position of the pillar-shaped electrode PE are coincident with each other. That is, in the pad structure of the related technique, since the X-coordinate of the point of effort and the X-coordinate of the point of load are coincident with each other, this case increases the magnitude of the repetitive stress applied onto the point of load. From the above-described manner, in the pad structure of the related technique shown in FIG. 9, a large stress is applied onto the joining portion of the pillar-shaped electrode PE with the pad PD, and the peeling off tends to occur at the joining interface between the pad PD and the pillar-shaped electrode PE.

On the other hand, in the pad structure in the present embodiment shown in FIG. 13 and FIG. 15, the center position of the opening region OP2 and the center position of the pillar-shaped electrode PE are shift from each other by extending the pillar-shaped electrode PE from the opening region OP2 toward the probe mark PM, and therefore, the X-coordinate of the point of effort and the X-coordinate of the point of load are shifted from each other when the stress caused based on the heat load is applied. The positional shift between the X-coordinate of the point of effort and the X-coordinate of the point of load means the smaller magnitude of the repetitive stress applied onto the point of load than that in the case in which the X-coordinate of the point of effort and the X-coordinate of the point of load are coincident with each other. That is, since the stress applied onto the point of load becomes large when the point of effort and the point of load are coincident with each other, the present embodiment has been intentionally devised so that the center position of the opening region OP2 and the center position of the pillar-shaped electrode PE are shifted from each other so as not to make the point of effort and the point of load coincident with each other. Therefore, in the pad structure of the present embodiment, the magnitude of the stress applied onto the joining portion of the pillar-shaped electrode PE with the pad PD can be made smaller than that in the pad structure of the related technique, so that the peeling at the joining interface between the pad PD and the pillar-shaped electrode PE can be suppressed.

As described above, the semiconductor device according to the present embodiment has the first feature point and the second feature point. However, these feature points are not individually different from each other, and have a relation to each other. This point will be described below.

For example, the technical concept of the first feature point is a concept obtained by paying attention to such a point that, when the probe mark PM is formed in the surface region of the pad PD exposed from the opening region OP2, the peeling off at the joining interface between the pad PD and the pillar-shaped electrode PE due to the probe mark clearly appears.

And, from the viewpoint of maximizing the technical significance of the first feature point, it is desired to separate the position of the probe mark PM and the position of the opening region OP2 away from each other as far as possible. This is because it is assumed that the position of the probe mark PM varies to some extent, and therefore, it is required to separate the position of the probe mark PM and the position of the opening region OP2 away from each other in order to prevent the formation of the probe mark PM inside the opening region OP2 even when the position of the probe mark PM varies.

Therefore, in the present embodiment, as shown in FIG. 12, the probe mark PM and the opening region OP2 are arranged so as to be aligned in the long side direction of the pad PD, and besides, the probe mark PM is formed on one of short sides (on a left short side of FIG. 12) of the pad PD, and the opening region OP2 is formed on the other short side (a right short side of FIG. 12). That is, as shown in FIG. 12, the electrode end EE1 and the electrode end EE2 of the pillar-shaped electrode PE and the opening end OE1 and the opening end OE2 of the opening region OP2 are aligned along the long side direction of the pad PD. Thus, according to the present embodiment, the position of the probe mark PM and the position of the opening region OP2 can be sufficiently separated from each other, so that this configuration maximizes the technical significance of the first feature point.

Meanwhile, when the configuration of the first feature point is adopted, it is required not to overlap the probe mark PM with the opening region OP2, and this means that it is required to secure a probe region PBR in the surface region of the pad PD having a limited profile size so as to be different from the surface region of the pad PD exposed from the opening region OP2. As a result, in the surface region of the pad PD, it is required to reduce the surface region of the pad PD exposed from the opening region OP2 so as to be smaller than that of the related technique. That is, in the present embodiment, as the result of adopting the above-described first feature point, the plane size of the opening region OP2 becomes smaller than that of the related technique.

From the above-described manner, for example, as the pillar-shaped electrode PE of the present embodiment, when the pillar-shaped electrode PE having almost the same size as that of the opening region OP2 when seen in a plan view is adopted as similar to the related technique shown in FIG. 8, the plane size of the opening region OP2 in the present embodiment is made small as described above, and, as a result, the plane size of the pillar-shaped electrode PE also becomes small. As a result, the area of the joining portion of the pillar-shaped electrode PE becomes small, the peeling off at the joining portion of the pillar-shaped electrode PE tends to occur.

Therefore, the present embodiment has been further devised while adopting the first feature point. This device corresponds to the second feature point. That is, the technical concept of the second feature point is a concept obtained by paying attention to a point of increasing the area of the joining portion of the pillar-shaped electrode PE. In order to objectify the concept, the pillar-shaped electrode PE according to the present embodiment has a second portion that is extended over the probe region PBR from the upper portion of the opening region OP2 so as to be formed in contact with the protective insulating film PIF in addition to a first portion formed on a small surface region of the pad PD exposed from the opening region OP2.

At this time, it is considered that, for example, the second portion of the pillar-shaped electrode PE is configured so as to be extended to largely protrude from the long side of the opening region OP2 in FIG. 12. However, in this configuration, a risk of contact between the pillar-shaped electrodes PE protruding from the respective adjacent pads PD increases, and therefore, it is required to expand the pitch between the pads PD in order to prevent the contact between the adjacent pillar-shaped electrodes PE. As a result, there is a concern about increase in the size of the semiconductor chip. Therefore, it is not good idea to configure the pillar-shaped electrode PE so as to largely protrude from the long side of the opening region OP2, either.

For this reason, it is considered as a next consideration that, for example, the second portion of the pillar-shaped electrode PE is configured so as to be extended to protrude from the short side of the opening region OP2 on the farthest side away from the probe mark PM in FIG. 12. However, in this configuration, more particularly, in the pad PD formed on the end side of the semiconductor chip, the short side of the pad PD on the farthest side away from the probe mark PM is formed in the vicinity of the end side of the semiconductor chip. Therefore, the gap between the end side of the semiconductor chip and the short side of the pad PD becomes narrow, and a risk of protrusion of the pillar-shaped electrode PE from the end side of the semiconductor chip increases. As a result, there is a concern about increase in the size of the semiconductor chip including the pillar-shaped electrode PE. Therefore, it is not good idea to configure the pillar-shaped electrode PE so as to be extended to largely protrude from the short side of the opening region OP2 on the farthest side away from the probe mark PM, either.

Accordingly, a configuration obtained by objectifying the second feature point in consideration of putting the size of the pad structure formed of the pad PD and the pillar-shaped electrode PE into the size of the pad PD while sufficiently exerting the technical significance of the first feature point is the pad structure of the present embodiment shown in FIG. 12 and FIG. 13. That is, according to the pad structure of the present embodiment, the pillar-shaped electrode PE has a second portion that is extended over the probe region PBR from the opening region OP2 so as to be formed in contact with the protective insulating film PIF in addition to the first portion formed on the opening region OP2. More specifically, since the pillar-shaped electrode PE in the present embodiment has the second portion that is extended toward the probe mark PM, the area of the joining portion of the pillar-shaped electrode PE can be increased. That is, the pillar-shaped electrode PE in the present embodiment has the second portion extending toward the probe mark PM, so that the technical significance of the second feature point is exerted.

Moreover, by the second feature point in the present embodiment, the center position of the pillar-shaped electrode PE is easily shifted from the center position of the opening region OP2 toward the probe mark side, so that the effect for reducing the magnitude of the repetitive stress applied onto the point of load can be easily exerted when the stress caused based on the heat load is applied.

As described above, according to the present embodiment, by providing the first feature point and the second feature point and considering the relation between these feature points, the pad structure in the present embodiment is objectified. As a result, according to the present embodiment, each of an advantage unique to the first feature point and an advantage unique to the second feature point can be maximized. That is, according to the present embodiment, the peeling off at the joining interface between the pad PD and the pillar-shaped electrode PE based on the above-described first factor and second factor can be effectively suppressed by the synergistic effect of the first feature point and the second feature point. Therefore, according to the semiconductor device of the present embodiment, even when a heat load is applied by a temperature cycle test or others, the reduction in the reliability of the semiconductor device caused by the peeling off at the joining interface between the pad PD and the pillar-shaped electrode PE can be suppressed. In other words, according to the present embodiment, a semiconductor device having high reliability, which is superior in stress resistance caused by a heat load can be provided.

<Method of Manufacturing Semiconductor according to Embodiment>

The semiconductor device according to the present embodiment is configured as described above, and a method of manufacturing the semiconductor device will be explained with reference to drawings.

Figure 17:
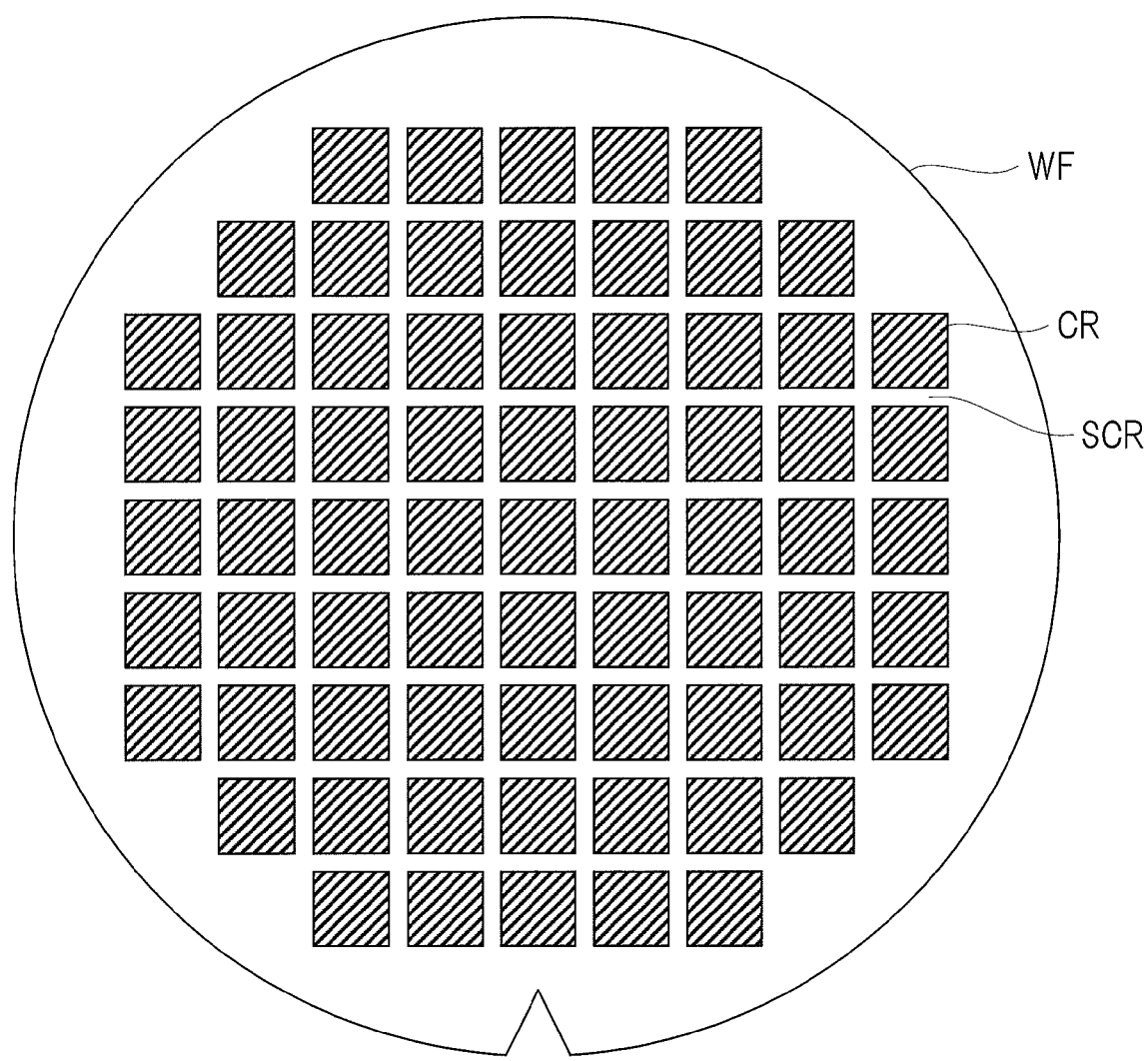
FIG. 17 is a plan view showing a layout configuration of the semiconductor wafer.

FIG. 17 is a plan view showing a layout configuration of a semiconductor wafer WF. As shown in FIG. 17, the semiconductor wafer WF has a substantially disc shape, and has a plurality of chip regions CR in its inner region. A semiconductor element represented by a field-effect transistor and a multilayer wiring layer are formed on each of the plurality of chip regions CR, and the plurality of chip regions CR are partitioned by a scribe region SCR. In the present embodiment, as shown in FIG. 17, a semiconductor wafer (semiconductor substrate) WF having a rectangular chip region CR and a scribe region SCR that partitions the chip region CR is prepared. In this stage, a semiconductor element represented by a field-effect transistor is formed on each of the plurality of chip regions CR of the semiconductor wafer WF, and a multilayer wiring layer made of copper wiring is formed above the semiconductor element by, for example, a damascene method. Moreover, in the following steps, processes of forming pads on the uppermost layer of the multilayer wiring layer in each of the plurality of chip regions CR will be first explained.

Figure 18:
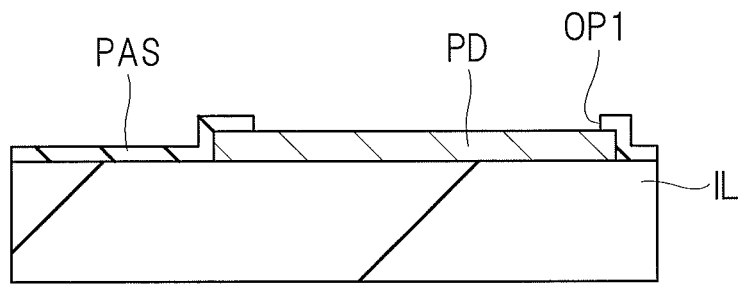
FIG. 18 is a cross-sectional view showing a step of manufacturing a semiconductor device according to the embodiment.

First, as shown in FIG. 18, on an interlayer insulating film IL formed on the chip region of the semiconductor wafer, pads PD are formed. More specifically, on the interlayer insulating film IL, for example, a conductor film containing aluminum as its main component is formed, and then, the conductor film is patterned so that the pads PD are formed by using a photolithography technique and an etching technique.

Here, in the present specification, the wording "main component" refers to a material component that is contained in the most amount of the material components forming members (layer and film). For example, a wording "pad containing aluminum as the main component" means that the material of the pad PD contains aluminum (Al) in the most amount. In the present specification, the wording "main component" is intended to express a matter that, for example, although the pad PD is basically made of aluminum, a case of additionally containing an impurity is not excluded.

For example, the conductor film containing aluminum as its main component referred to in the present specification is used to be not only a pure aluminum film but also in a wide concept including an aluminum alloy film (AlSi film) in which silicon is added to aluminum and an aluminum alloy film (AlSiCu film) in which silicon and copper are added to aluminum. Therefore, the pad PD including these aluminum alloy films is also included in "the pad PD containing aluminum as its main component".

Next, a surface protective film PAS is formed on the interlayer insulating film IL so as to cover the pads PD. The surface protective film PAS can be formed of, for example, a laminated film of a silicon oxide film and a silicon nitride film by using, for example, a CVD (Chemical Vapor Deposition) method. Then, by using a photolithography technique and an etching technique, the surface protective film PAS is patterned. The surface protective film PAS is patterned so as to form an opening region OP1 that partially opens the surface region of the pad PD on the surface protective film PAS.

Subsequently, by pressing a probe needle onto the surface region of the pad PD exposed from the opening region OP1, an electrical characteristic inspection is executed on an integrated circuit formed on each of the plurality of chip regions. This process will be explained below.

Figure 19:
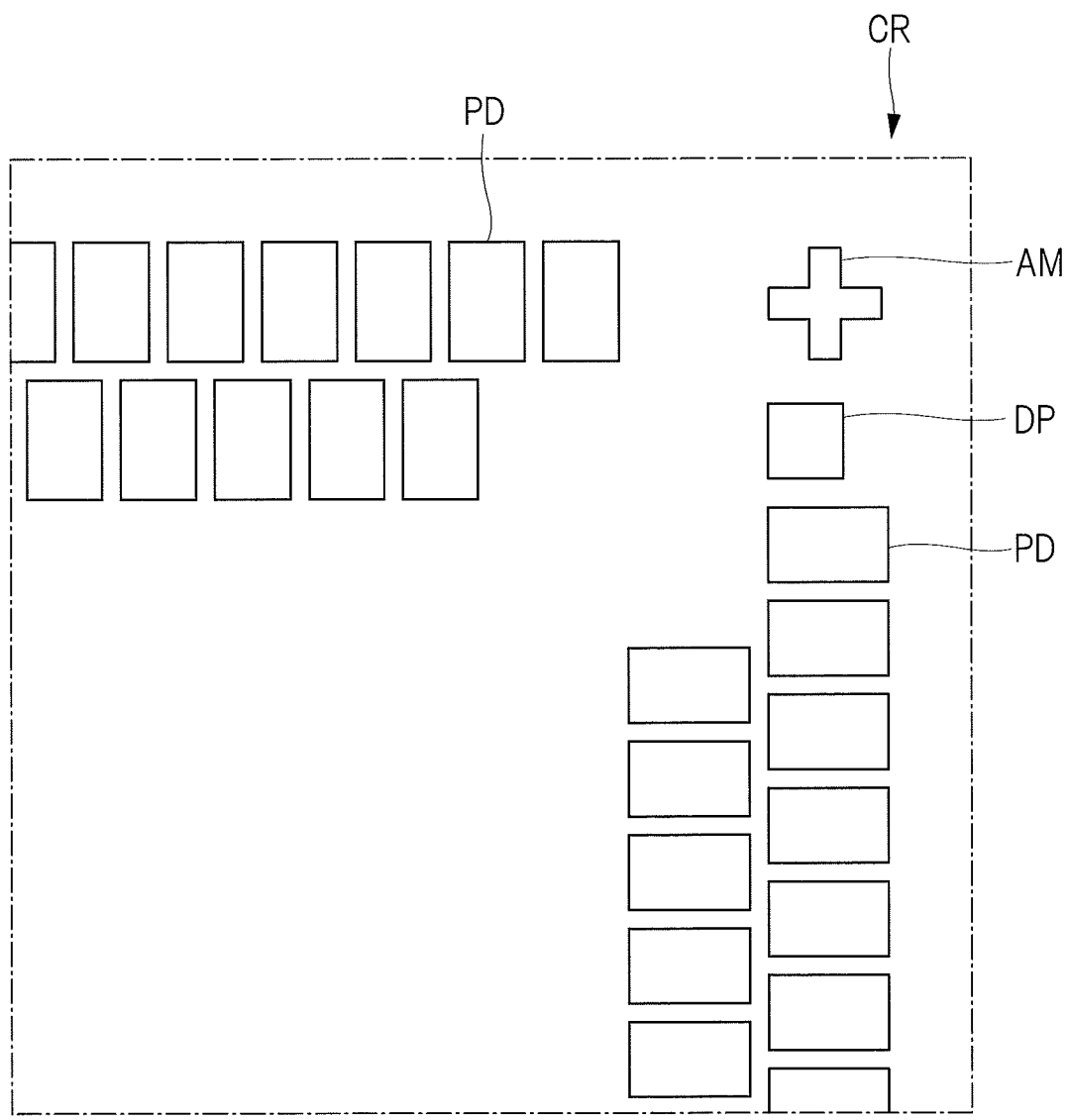
FIG. 19 is a schematic view showing a part of a chip region included in the semiconductor wafer so as to be enlarged.

FIG. 19 is a schematic view showing a part of the chip region CR existing in the semiconductor wafer so as to be enlarged. As shown in FIG. 19, a plurality of pads PD are formed on the chip region CR in, for example, a staggered arrangement of two rows, and the electrical characteristic inspection is executed by pressing the probe needle onto each of the probe regions of the plurality of pads PD.

However, in this stage, the protective insulating film PIF has not been formed yet, and the opening region OP2 on the protective insulating film PIF has not been formed yet, either. Therefore, it is difficult to determine which region in the surface region of the pad PD is the probe region PBR other than the opening region OP2. That is, in the present embodiment, it is required to press the probe needle onto the probe region PBR in the surface region of the pad PD. However, in a stage before the formation of the opening region OP2, it is difficult to specify the probe region PBR. In this case, there is a possibility that the probe needle is pressed onto not the probe region PBR of the pad PD but the opening region OP2.

Figure 20:
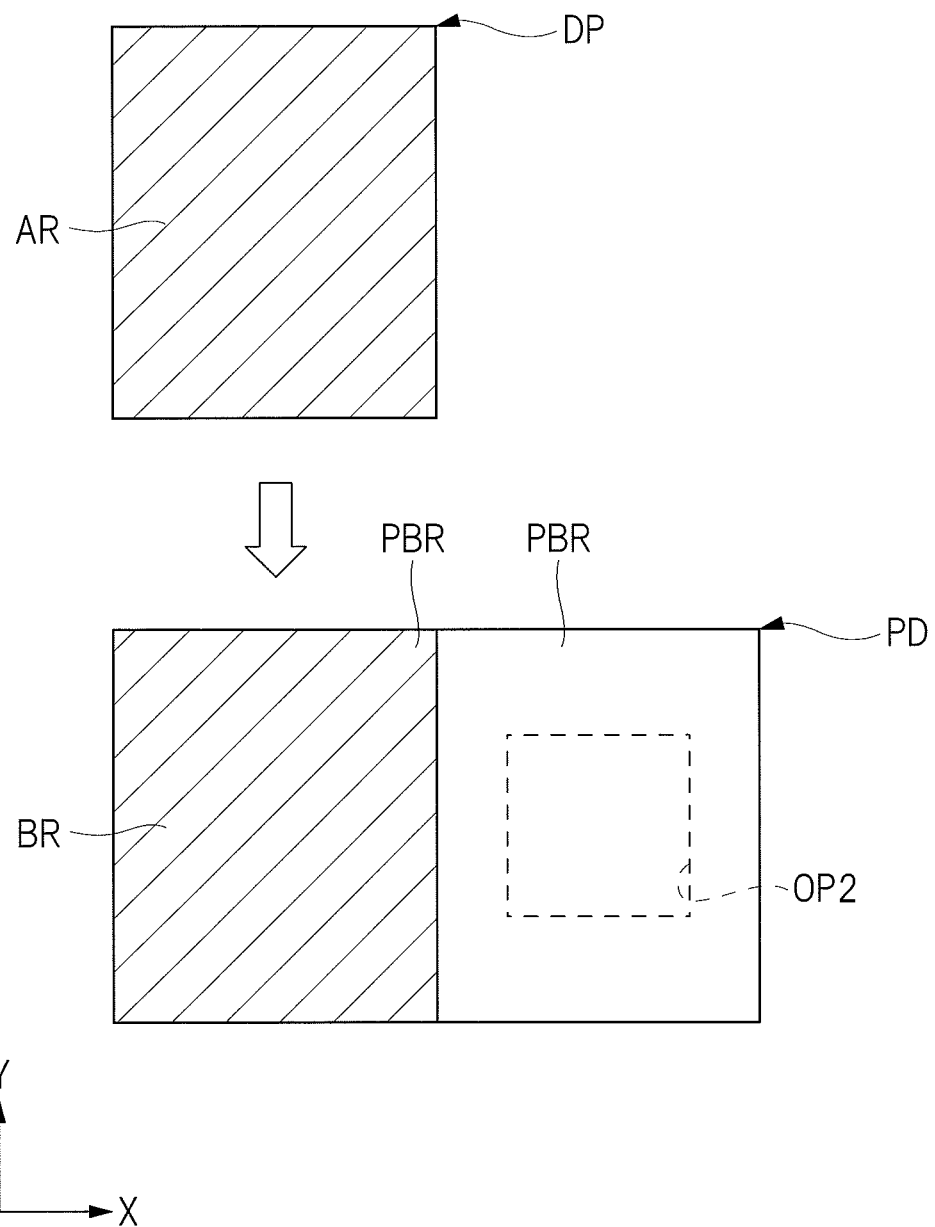
FIG. 20 is a schematic view showing a positional relation between a dummy pad and a pad.

Therefore, in the present embodiment, as shown in FIG. 19, dummy pads DP are formed as a mark for use in specifying the probe region so as to be aligned with the pads PD along the arrangement direction of the plurality of pads PD. That is, in the present embodiment, the dummy pad DP is provided so as to specify the position of the probe region PBR in the surface region of the pad PD before the formation of the opening region OP2. More specifically, as shown in FIG. 20, when a region AR of the dummy pad DP is parallel shifted along the arrangement direction of the pads PD (along the Y direction), the dummy pads DP are arranged so that the region BR of the pad PD overlapped with the area AR of the dummy pad is included in the probe region PBR of the pad PD.

Figure 21:
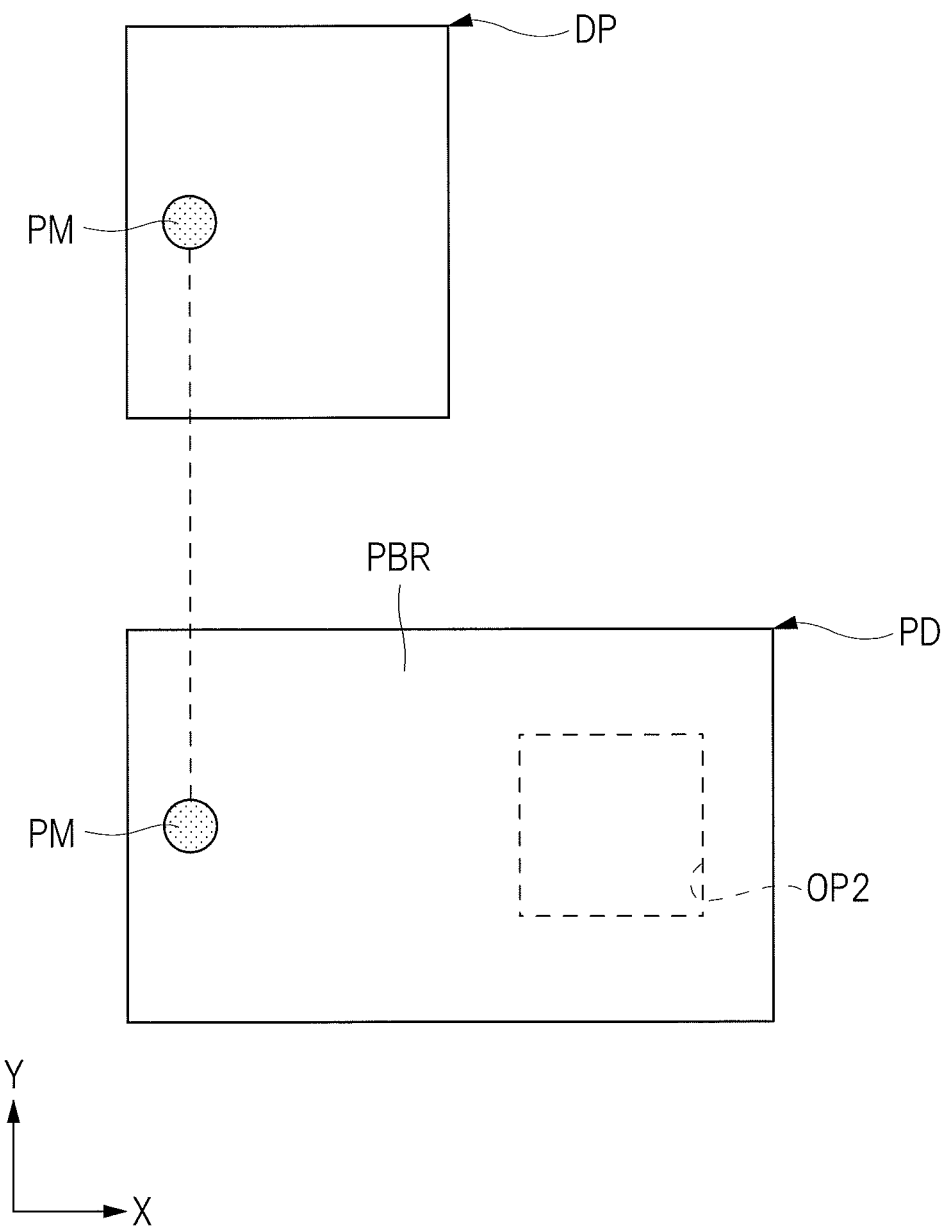
FIG. 21 is a schematic view showing a relation between a probe mark formed on the dummy pad and a probe mark formed on the pad.

Therefore, for example, as shown in FIG. 21, by adjusting the position of the probe needle so that the probe needle is made in contact with the dummy pad DP, the probe needle is necessarily pressed onto the probe region PBR in the pad PD. That is, since the plurality of probe needles are arranged so as to be aligned along the arrangement direction of the plural pads PD, when one of the plurality of probe needles is made in contact with the surface region of the dummy pad DP, the probe needle to be pressed onto the pad PD is pressed onto the surface region of the pad PD overlapped with the surface region of the dummy pad DP in the parallel movement of the surface region of the dummy pad DP along the arrangement direction of the pads PD. For this reason, in the parallel movement of the surface region of the dummy pad DP along the arrangement direction of the pads PD, if the dummy pads DP are arranged so that the surface region of the pad PD to be overlapped with the surface region of the dummy pad DP is included in the probe region PBR, the probe needle is automatically pressed onto the probe region PBR of the pad PD. Therefore, according to the present embodiment, even in the stage having no formation of the opening region OP2, the probe needle can be securely pressed onto not the opening region OP2 but the probe region PBR in the surface region of the pad PD.

From the above-described manner, the dummy pad DP is formed in the chip region of the present embodiment, and a probe mark PM which is a mark formed by pressing the probe needle is also formed on the dummy pad DP as shown in FIG. 21. Moreover, as shown in FIG. 21, when the position of the probe mark PM formed on the dummy pad DP is parallel moved along the arrangement direction of the pads PD (along the Y direction), the position of the probe mark PM formed on the dummy pad is overlapped with the position of the probe mark PM formed on the pad PD.

Note that the dummy pads DP are formed at, for example, two portions of the chip region (semiconductor chip). More specifically, as shown in FIG. 7, one corresponding to the outside pad (outer circumferential pad) and one corresponding to the inside pad (inner circumferential pad) of the plurality of pads PD arranged in the staggered arrangement of two rows are arranged on a diagonal line. That is, the dummy pad DP corresponding to the outer circumferential pad is arranged so as to be aligned with the outer circumferential pad, and the dummy pad DP corresponding to the inner circumferential pad is arranged so as to be aligned with the inner circumferential pad. As a result, while adjusting the position of the probe needle so that the probe needle is pressed onto the dummy pad DP corresponding to the outer circumferential pad, the position of the probe needle can be also adjusted so that the probe needle is pressed onto the dummy pad DP corresponding to the inner circumferential pad, which is a dummy pad DP arranged on the orthogonal line. Thus, in all the plurality of pads arranged in the staggered arrangement of two rows, the probe needle can be pressed onto the probe region PBR, and besides, the position of the probe needle in the rotation direction can be simultaneously adjusted.

Figure 22:
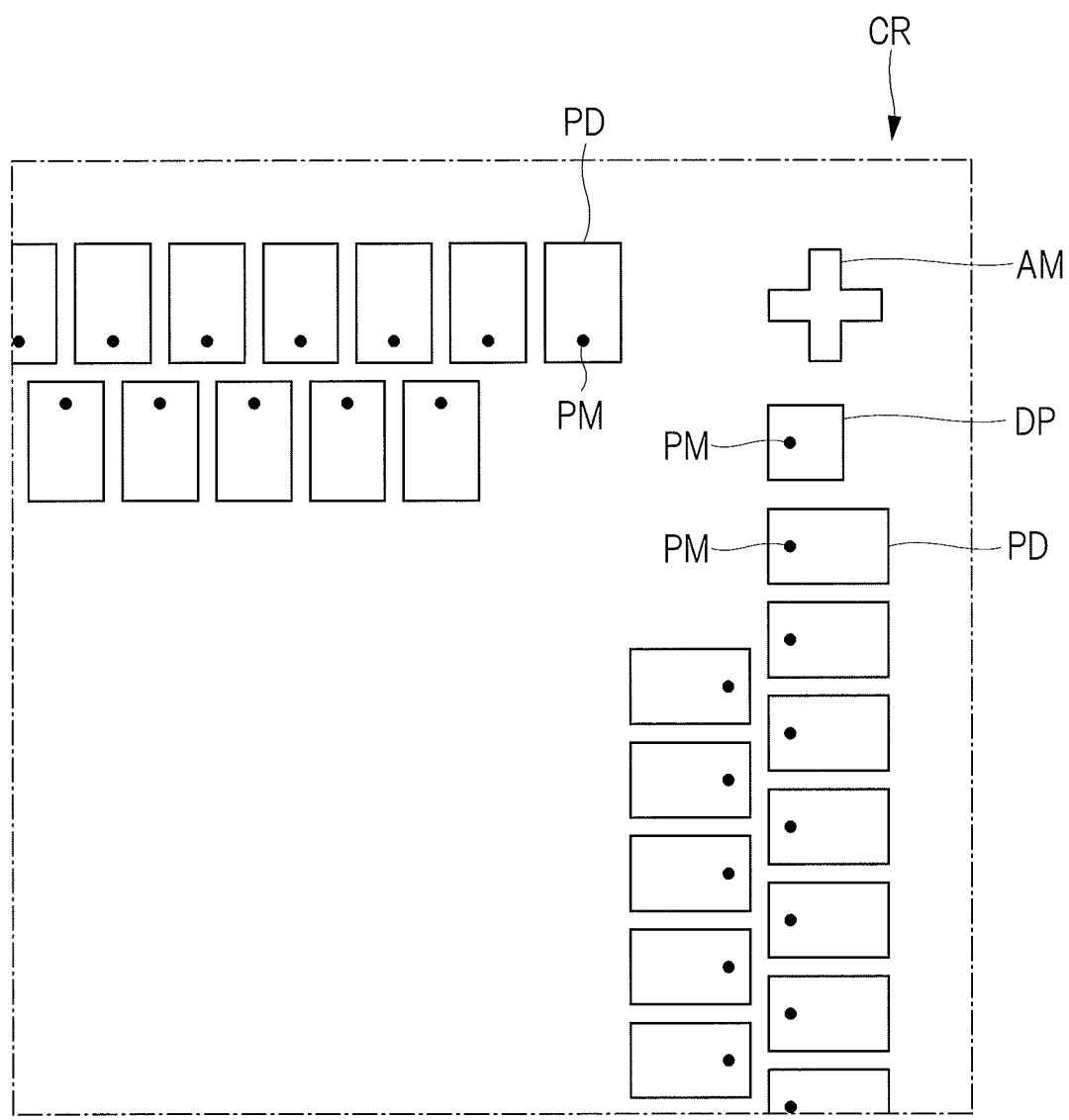
FIG. 22 is a schematic view showing a part of the chip region obtained after an electrical characteristic inspection so as to be enlarged.
Figure 23:
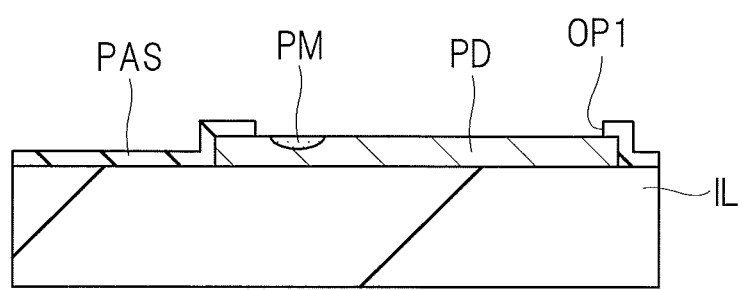
FIG. 23 is a cross-sectional view showing a step of manufacturing a semiconductor device according to the embodiment.

In this manner, the electrical characteristic inspection is executed by pressing the probe needle onto the probe region PBR of each of the plurality of pads PD. As a result, as shown in FIG. 22, the probe marks PM that are marks caused by pressing the probe needle onto the plurality of pads PD and dummy pads DP formed on the chip region CR are formed. For example, as shown in FIG. 23, the probe mark PM is formed on the surface region (probe region) of the pad PD.

Figure 24:
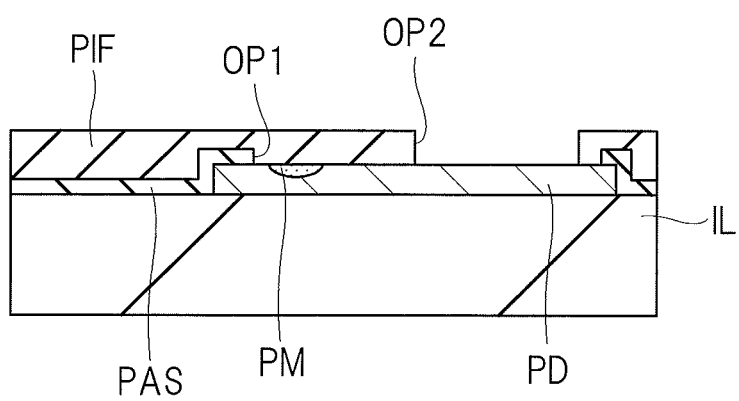
FIG. 24 is a cross-sectional view showing a step of manufacturing the semiconductor device, continued from FIG. 23.

Subsequently, as shown in FIG. 24, the protective insulating film PIF covering the surface region of the pad PD is formed. The protective insulating film PIF is formed of, for example, a polyimide resin film by, for example, a coating method. Then, by using a photolithography technique and an etching technique, the opening region OP2 is formed on the protective insulating film PIF. The surface region of the pad PD is exposed from the opening region OP2. At this time, in the present embodiment, the probe mark PM is formed on the probe region other than the opening region OP2, and therefore, the probe mark PM is not exposed from the opening region OP2 but covered with the protective insulating film PIF.

Figure 25:
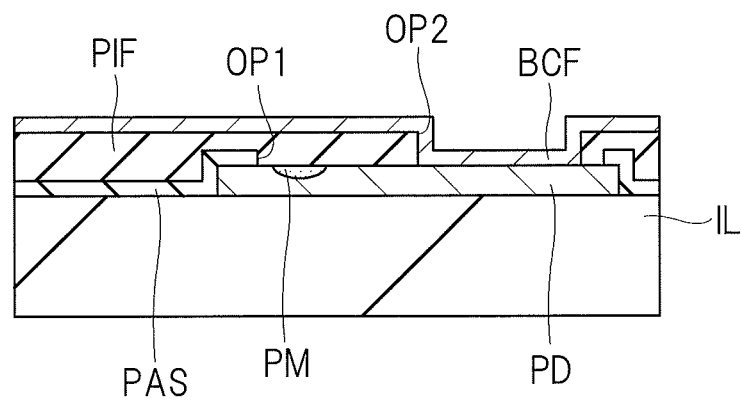
FIG. 25 is a cross-sectional view showing a step of manufacturing the semiconductor device, continued from FIG. 24.

Next, as shown in FIG. 25, on the protective insulating film PIF with the opening region OP2 formed thereon, a barrier conductor film BCF is formed. The barrier conductor film BCF can be formed of, for example, a titanium nitride film (TiN film), a titanium film (Ti film) or a titanium tungsten film (TiW film) or others by using, for example, a sputtering method.

Figure 26:
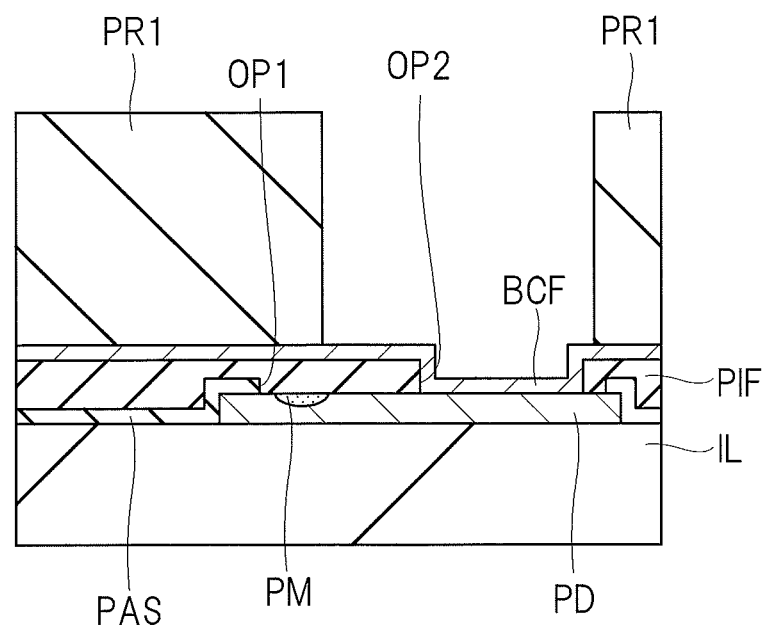
FIG. 26 is a cross-sectional view showing a step of manufacturing the semiconductor device, continued from FIG. 25.

Moreover, as shown in FIG. 26, after coating the barrier conductor film BCF with a resist film PR1, the resist film PR1 is patterned by using a photolithography technique. The resist film PR1 is patterned so that a pillar-shaped electrode formation region is opened.

Figure 27:
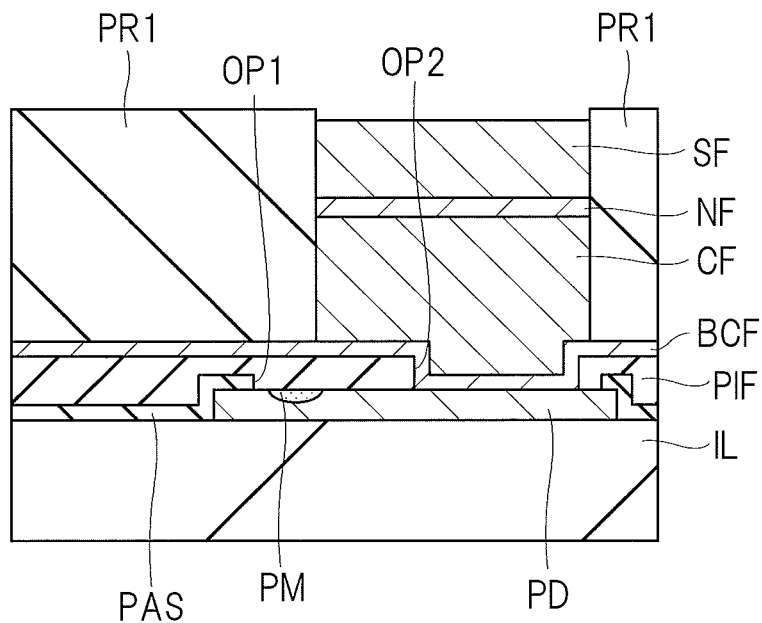
FIG. 27 is a cross-sectional view showing a step of manufacturing the semiconductor device, continued from FIG. 26.
Figure 28:
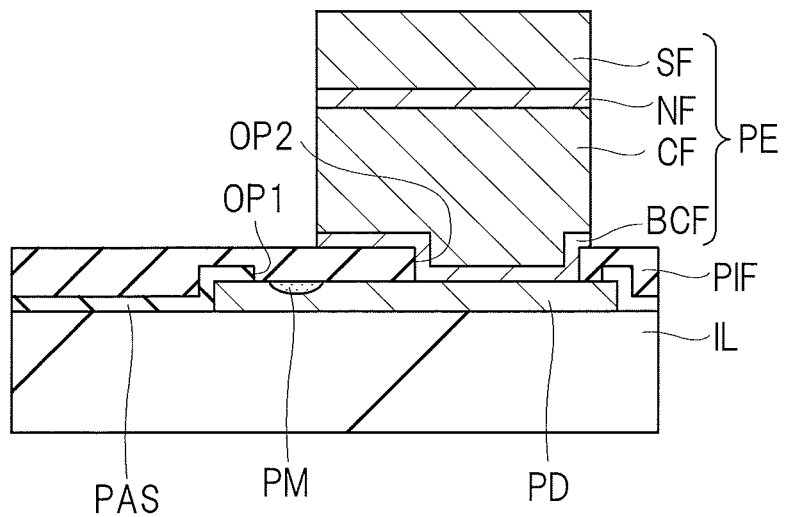
FIG. 28 is a cross-sectional view showing a step of manufacturing the semiconductor device, continued from FIG. 27.
Figure 29:
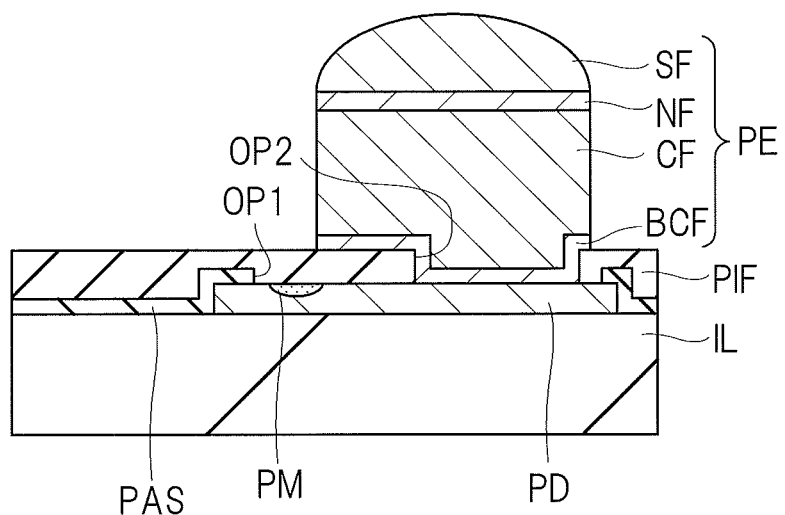
FIG. 29 is a cross-sectional view showing a step of manufacturing the semiconductor device, continued from FIG. 28.

Subsequently, as shown in FIG. 27, a copper film CF, a nickel film NF and a solder film SF are successively formed so as to bury the opening region of the resist film PR1 by using an electrolytic plating method using the barrier conductor film BCF as an electrode film. Then, as shown in FIG. 28, a pillar-shaped electrode PE formed of the barrier conductor film BCF, the copper film CF, the nickel film NF and the solder film SF can be formed by removing the resist film PR1 by using, for example, an ashing technique, and besides, by further removing the barrier conductor film BCF exposed by the removal of the resist film PR1 by using, for example, a wet etching method. And, as shown in FIG. 29, for example, by performing a heating treatment (reflow), the solder film SF formed in the uppermost layer of the pillar-shaped electrode PE is melted, so that the surface shape of the solder film SF is formed into a round shape. As described above, according to the present embodiment, the pillar-shaped electrode PE to be electrically connected to the pad PD is formed on each of the plurality of pads PD formed on the chip regions of the semiconductor wafer.

Then, by dicing the scribe region that partitions the plurality of chip regions formed on the semiconductor wafer so that the plurality of chip regions are divided into pieces, the semiconductor chips can be manufactured. A step of mounting the semiconductor chips on a wiring substrate will be explained below.

Figure 30:
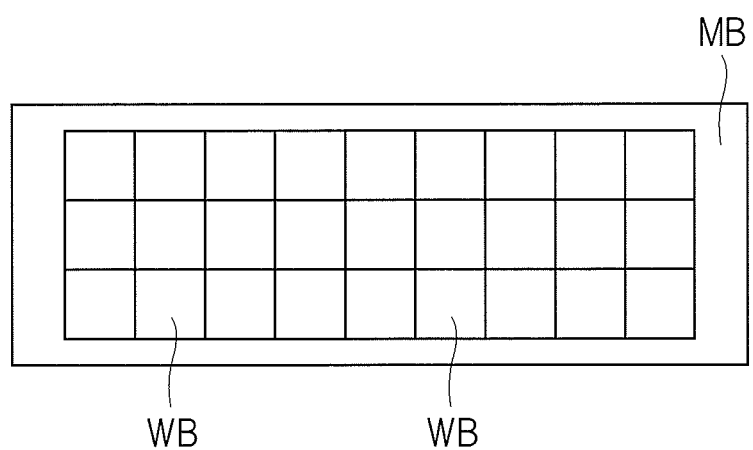
FIG. 30 is a plan view showing a multi-piece taking substrate on which a plurality of wiring substrates are formed.

First, a multi-piece taking substrate MB on which a plurality of wiring substrates WB are formed is prepared. For example, FIG. 30 is a plan view showing the multi-piece taking substrate MB on which the plurality of wiring substrates WB are formed. As shown in FIG. 30, the multi-piece taking substrate MB has a configuration in which, for example, the plurality of wiring substrates WB are connected with each other in an array state. A terminal (bonding finger) made of, for example, a copper material is formed on each of these wiring substrates WB although not shown, and a gold film (Au film) is formed on the upper surface and side faces of the terminal. Here, for example, a nickel film (Ni film) or a palladium film (Pd film) is interpolated between the terminal and the gold film in some cases. Furthermore, on the upper surface and the side faces of the terminal, a solder film made of tin (Sn), SnAg (silver tin), or others, may be formed, or a pre-flux process (OSP process) may be performed.

Figure 31:
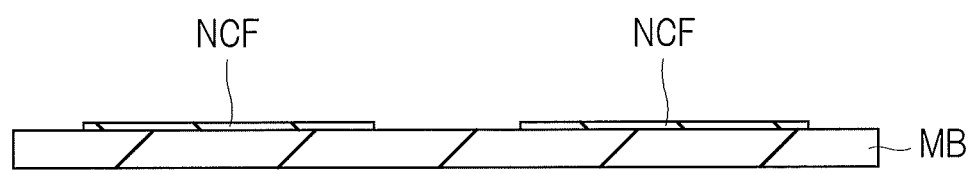
FIG. 31 is a cross-sectional view showing a step of manufacturing a semiconductor device according to the embodiment.
Figure 32:
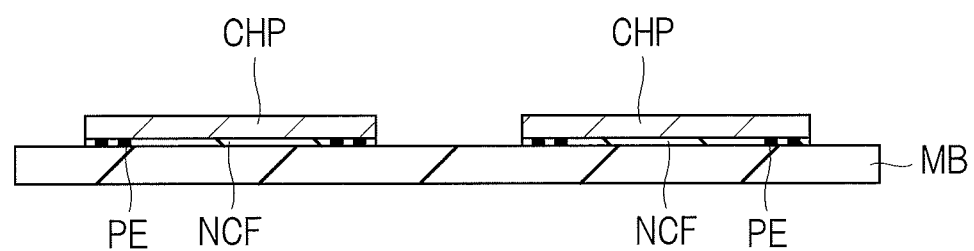
FIG. 32 is a cross-sectional view showing a step of manufacturing the semiconductor device, continued from FIG. 31.

Next, as shown in FIG. 31, on each of the surfaces of the plurality of wiring substrates formed on the multi-piece taking substrate MB, a pre-coat resin film NCF is arranged as a sealing material. Then, as shown in FIG. 32, the semiconductor chips CHP are mounted on the pre-coat resin film NCF in a direction in which the pillar-shaped electrodes PE is opposed to the surface of the multi-piece taking substrate MB so as to correspond to the plurality of wiring substrates formed on the multi-piece taking substrate MB, respectively. At this time, the semiconductor chips CHP are pressed into the pre-coat resin film NCF, so that the pillar-shaped electrodes PE formed on the semiconductor chips CHP are made in contact with the terminals (not shown) formed on the multi-piece taking substrate MB. In this state, by heating this at a temperature higher than the melting point of the solder, the solder film formed on the end portion of the pillar-shaped electrode PE and the terminal are connected with each other, and besides, the pre-coat resin film NCF is thermally cured, so that the gap between the semiconductor chip CHP and the multi-piece taking substrate MB is sealed by the pre-coat resin film NCF. Here, if the pre-coat resin film NCF is not sufficiently cured, it may be re-heated by using, for example, an oven.

Note that, in the present embodiment, an example of using the pre-coat resin film NCF as the sealing material has been explained. However, the sealing material is not limited to this, and, for example, a pre-coat resin paste may be used. Moreover, regarding the sealing material, an under fill may be permeated between the semiconductor chip CHP and the multi-piece taking substrate MB by utilizing a capillary phenomenon after the semiconductor chip CHP has been mounted on the multi-piece taking substrate MB, or resin may be injected between the semiconductor chip and the multi-piece taking substrate MB by using a transfer molding technique. Moreover, in the present embodiment, as shown in FIG. 31, an example of arrangement of the pre-coat resin film NCF on the multi-piece taking substrate MB has been explained. However, for example, the pre-coat resin film NCF may be adhered to the semiconductor chips CHP.

Figure 33:
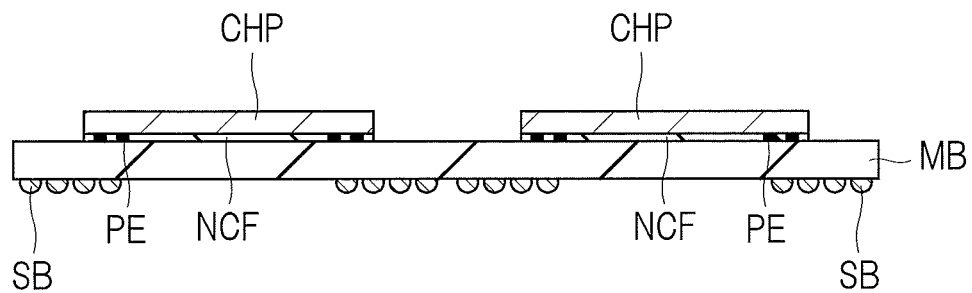
FIG. 33 is a cross-sectional view showing a step of manufacturing the semiconductor device, continued from FIG. 32.
Figure 34:
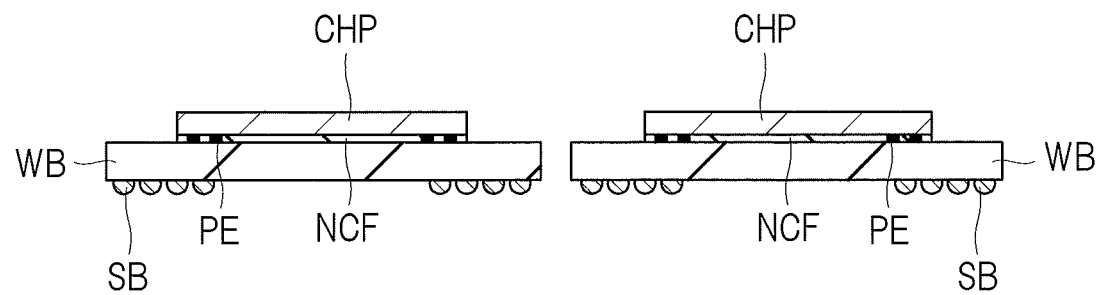
FIG. 34 is a cross-sectional view showing a step of manufacturing the semiconductor device, continued from FIG. 33.

Subsequently, as shown in FIG. 33, a plurality of solder balls SB that function as the external connection terminals are attached onto the rear surface (surface opposed to the surface on which the semiconductor chips are mounted) of the multi-piece taking substrate MB. Also in this process, a heating treatment is performed. Then, as shown in FIG. 34, by dicing the multi-piece taking substrate MB, the multi-piece taking substrate MB is divided into a plurality of wiring substrates WB. As described above, according to the present embodiment, a semiconductor device in which a semiconductor chip is mounted on the wiring substrate WB can be manufactured.

In the above-described description, the manufacturing method using the multi-piece taking substrate MB has been explained. However, the manufacturing may be performed with a previously-divided substrate.

Here, in the method of manufacturing the semiconductor device in the present embodiment, a heat load (heating treatment) is applied as described above in order to, for example, melt the solder film formed on the tip portion of the pillar-shaped electrode PE or thermally cure the pre-coat resin film NCF for the connection with the terminal formed on the multi-piece taking substrate. Moreover, the heat load is also applied upon attaching the plurality of solder balls SB onto the rear surface of the multi-piece taking substrate MB. Furthermore, after the semiconductor device is manufactured, a temperature cycle test is executed as a reliability test, and the heat load is applied to the semiconductor device by this temperature cycle test. In this manner, onto the semiconductor device according to the present embodiment, a heat load is applied in various manufacturing processes.

Regarding the point, the semiconductor device in the present embodiment has the first feature point and the second feature point, and therefore, it has a pad structure in which the joining interface between the pad PD and the pillar-shaped electrode PE is difficult to be broken due to the stress based on the heat load. From this point, according to the semiconductor device in the present embodiment, the resistance against the heat load due to the temperature cycle test or others can be improved, so that the reliability of the semiconductor device can be improved.

FIRST MODIFIED EXAMPLE

Figure 35:
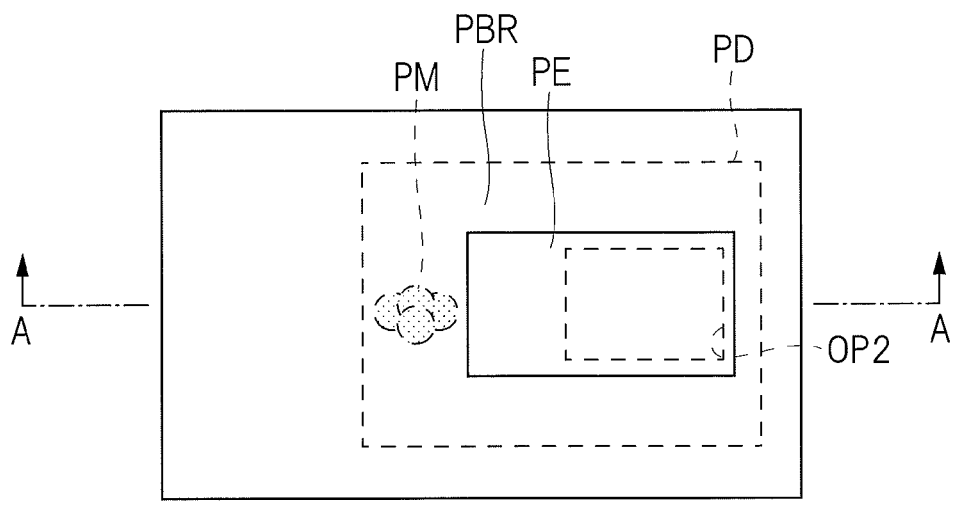
FIG. 35 is a plan view showing a structure of a pad according to a first modified example.
Figure 36:
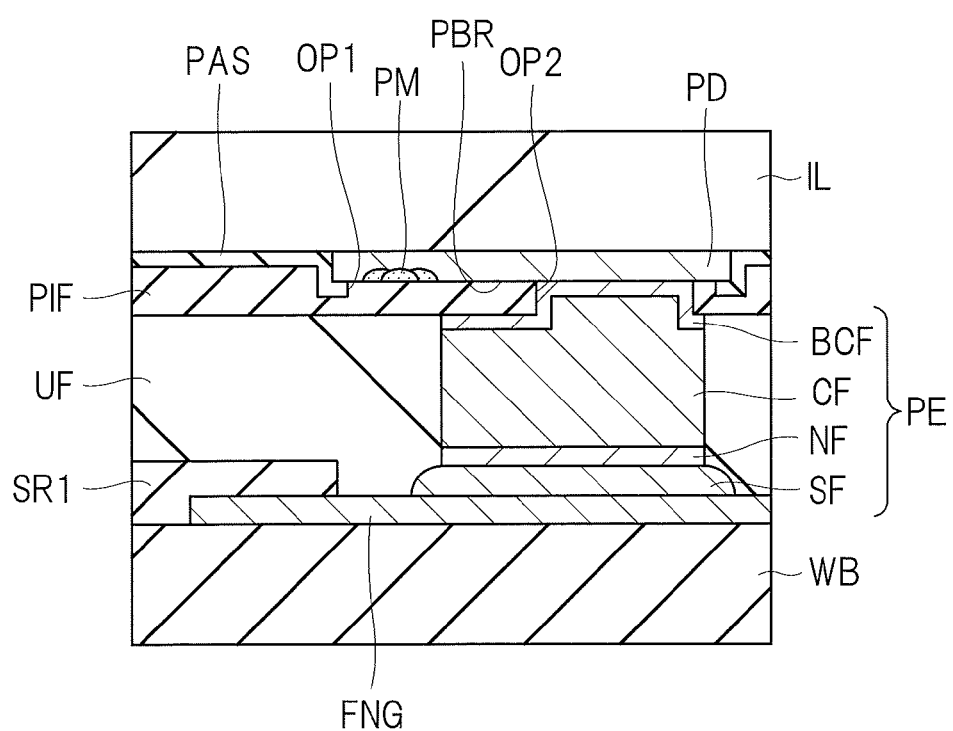
FIG. 36 is a cross-sectional view cut along a line A-A of FIG. 35.

Next, a first modified example of the embodiment will be explained. FIG. 35 is a plan view showing a pad structure according to the present first modified example, and FIG. 36 is a cross-sectional view cut along a line A-A of FIG. 35. As shown in FIG. 35 and FIG. 36, a probe mark PM is formed on the probe region PBR of the pad PD. That is, also in the present first modified example, as similar to the embodiment, no probe mark PM is formed in the surface region of the pad PD that is exposed from the opening region OP2. In other words, also in the present first modified example, as similar to the embodiment, the probe mark PM is formed on the probe region PBR. From this point, also in the present first modified example, the peeling off at the joining interface between the pad PD and the pillar-shaped electrode PE caused by the probe mark PM can be effectively suppressed.

More particularly, in this case, since the adhesion property at the joining interface between the pad PD and the pillar-shaped electrode PE is not influenced by the probe mark PM, the limitation of the number of contacts of the probe needle can be moderated. As a result, for example, as seen in the present first modified example, the electrical characteristic inspection can be executed by making the probe needle in contact with the pad PD a plurality of times. In this case, as shown in FIG. 35 and FIG. 36, in the present first modified example, a plurality of probe marks PM are formed in the probe region PBR of the pad PD.

As shown in FIG. 35, also in the present first modified example, since the opening region OP2 and the probe mark PM are arranged so as to be aligned with each other in the long side direction of the pad PD, the distance between the probe mark PM and the opening region OP2 can be separated away from each other. For this reason, even when a plurality of probe marks PM having variation in a position are formed in the probe region PBR of the pad PD, the probe mark PM can be prevented from being formed inside the opening region OP2.

SECOND MODIFIED EXAMPLE

Figure 37:
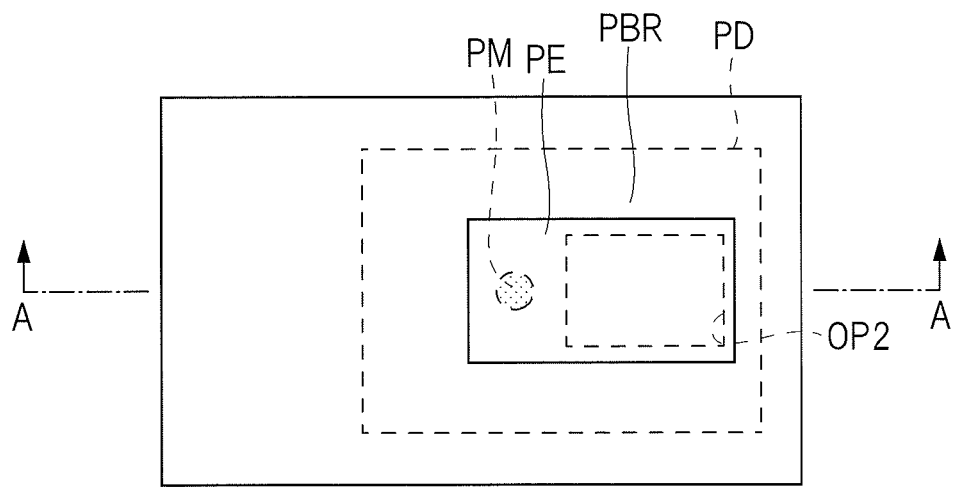
FIG. 37 is a plan view showing a structure of a pad according to a second modified example.
Figure 38:
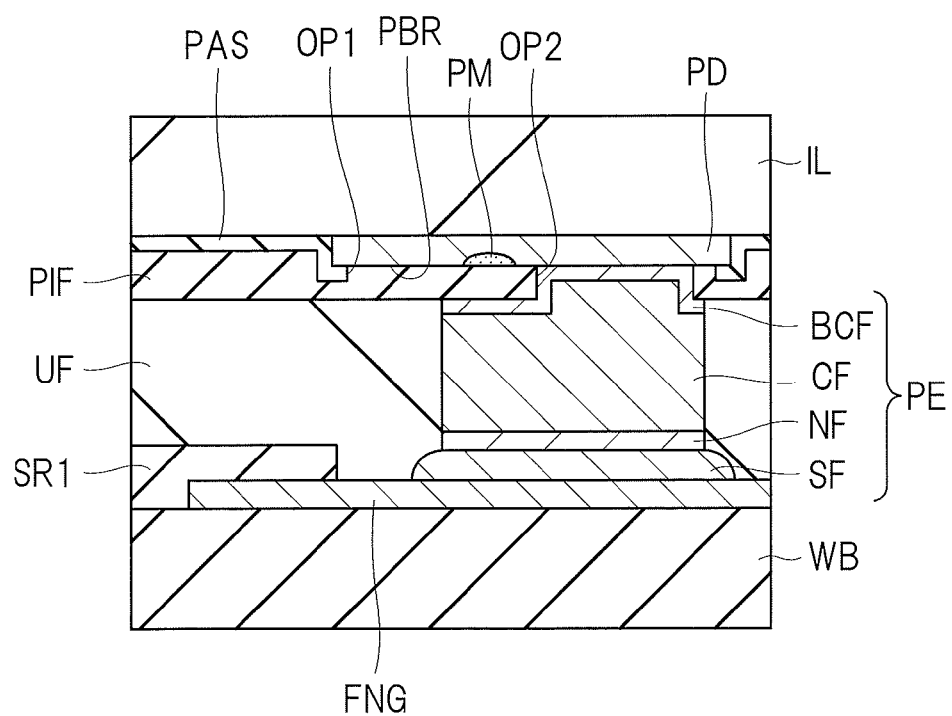
FIG. 38 is a cross-sectional view cut along a line A-A of FIG. 37.

Subsequently, a second modified example of the embodiment will be explained. FIG. 37 is a plan view showing a pad structure according to the present second modified example, and FIG. 38 is a cross-sectional view cut along a line A-A of FIG. 37. As shown in FIG. 37, a probe mark PM is formed on the probe region PBR also in the present second modified example as similar to the embodiment, and besides, the probe mark PM is formed so as to be included in the pillar-shaped electrode PE when viewed in a plan view. More specifically, the probe mark is included in a second portion of the pillar-shaped electrode that is extended over the probe region PBR from the upper portion of the opening region OP2. Also in this case, since the probe mark PM itself is formed in the probe region PBR of the pad PD, and besides, since a protective insulating film PIF is interposed between the probe mark PM and the pillar-shaped electrode PE as shown in FIG. 38, the peeling off at the joining interface between the pad PD and the pillar-shaped electrode PE caused by the probe mark PM can be effectively prevented also in the pad structure of the present second modified example.

Note that, in the present second modified example, the explanation has been made for the example in which the probe mark PM is completely included in the second portion of the pillar-shaped electrode that is extended from the upper portion of the opening region OP2 over the probe region PBR. However, for example, when seen in a plan view, the probe mark PM may be partially overlapped with the second portion of the pillar-shaped electrode PE.

THIRD MODIFIED EXAMPLE

Figure 39:
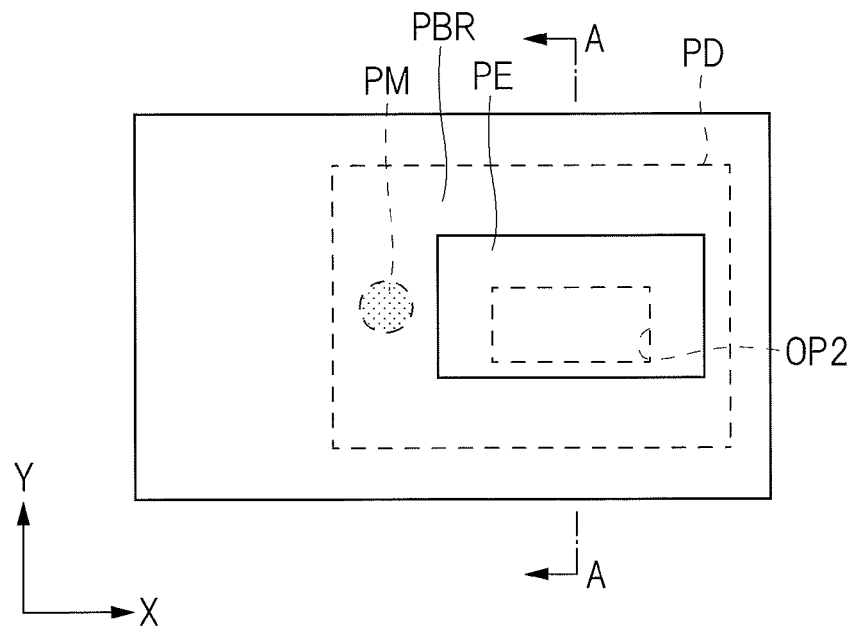
FIG. 39 is a plan view showing a structure of a pad according to a third modified example.
Figure 40:
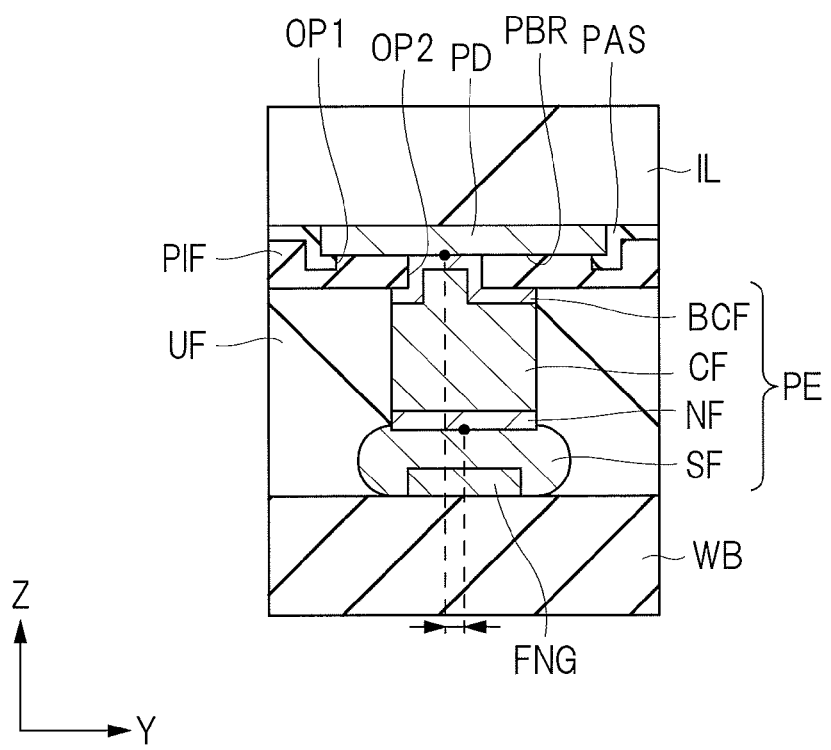
FIG. 40 is a cross-sectional view cut along a line A-A of FIG. 39.

Next, a third modified example of the embodiment will be explained. FIG. 39 is a plan view showing a pad structure according to the present third modified example, and FIG. 40 is a cross-sectional view cut along a line A-A of FIG. 39. As shown in FIG. 12 and FIG. 13, in the embodiment, the explanation has been made the example in which the center position of the pillar-shaped electrode PE and the center position of the opening region OP2 are shifted in the X direction. On the other hand, in the present third modified example, as shown in FIG. 39 and FIG. 40, the center position of the pillar-shaped electrode PE and the center position of the opening region OP2 are shifted in the Y direction. In other words, in the present third modified example, the positional shift between the center position of the pillar-shaped electrode PE opposed to the bonding finger FNG and the center position of the opening region OP2 is generated in the short side direction of the pad PD.

For example, by the repetitive heating and cooling caused by the heat load such as the temperature cycle test, a repetitive stress is applied onto the joining portion between the pad PD and the pillar-shaped electrode PE that is interposed between the bonding finger FNG and the pad PD due to difference in a linear expansion coefficient since the wiring substrate WB has a larger linear expansion coefficient than that of the semiconductor chip. At this time, for example, when the repetitive stress in the X direction is caused between the bonding finger FNG and the pad PD, the configuration as shown in the embodiment in which the center position of the pillar-shaped electrode PE and the center position of the opening region OP2 are shifted in the X direction is effective, and is effectively applied to, for example, the pad PD that is arranged in the center portion of the side (for example, right side) separated away from the corner portion of the semiconductor chip. On the other hand, in the pad arranged in the vicinity of the corner portion of the semiconductor chip, a component of the repetitive stress caused between the bonding finger FNG and the pad PD in the Y direction is also increased. Therefore, in this case, as shown in the present third modified example, a configuration in which the center position of the pillar-shaped electrode PE and the center position of the opening region OP2 are shifted in the Y direction by increasing the area of the contact surface between the pillar-shaped electrode PE and the protective insulating film PIF is effective.

In the case of the present third modified example, a portion in which, on a straight line (not shown) along not the X direction described in the above-described embodiment but the Y direction, a gap from one electrode end of the pillar-shaped electrode PE to the opening end of the opening region OP2 in the vicinity of the one electrode end has a wider portion in the pillar-shaped electrode PE than a gap from the other electrode end of the pillar-shaped electrode PE to the opening end of the opening region OP2 in the vicinity of the other electrode end. Therefore, the area of the contact surface between the pillar-shaped electrode PE and the protective insulating film PIF in the Y direction is increased, and, as a result, the center position of the opening region OP2 and the center position of the pillar-shaped electrode PE are shifted in the Y direction. Therefore, when a stress based on the heat load is applied, the Y-coordinate of the point of effort and the Y-coordinate of the point of load are shifted from each other. By increasing the area of the contact surface between the pillar-shaped electrode PE and the protective insulating film PIF in the Y direction, the joining strength between the pillar-shaped electrode PE and the protective insulating film PIF is enhanced, so that the joining strength between the pad PD and the pillar-shaped electrode PE can be supported, and, as a result, the peeling off at the joining interface between the pad PD and the pillar-shaped electrode PE can be suppressed. Moreover, the Y-coordinate of the point of effort and the Y-coordinate of the point of load are shifted from each other, and this means that the magnitude of the repetitive stress applied onto the point of load is made smaller than that in the case in which the Y-coordinate of the point of effort and the Y-coordinate of the side of action are coincident with each other. Therefore, particularly in the pad arranged in the vicinity of the corner portion of the semiconductor chip in the pad structure in the present third modified, the magnitude of the stress applied onto the joining portion of the pillar-shaped electrode PE with the pad PD, so that the peeling off at the joining interface between the pad PD and the pillar-shaped electrode PE can be suppressed.

FOURTH MODIFIED EXAMPLE

Figure 41:
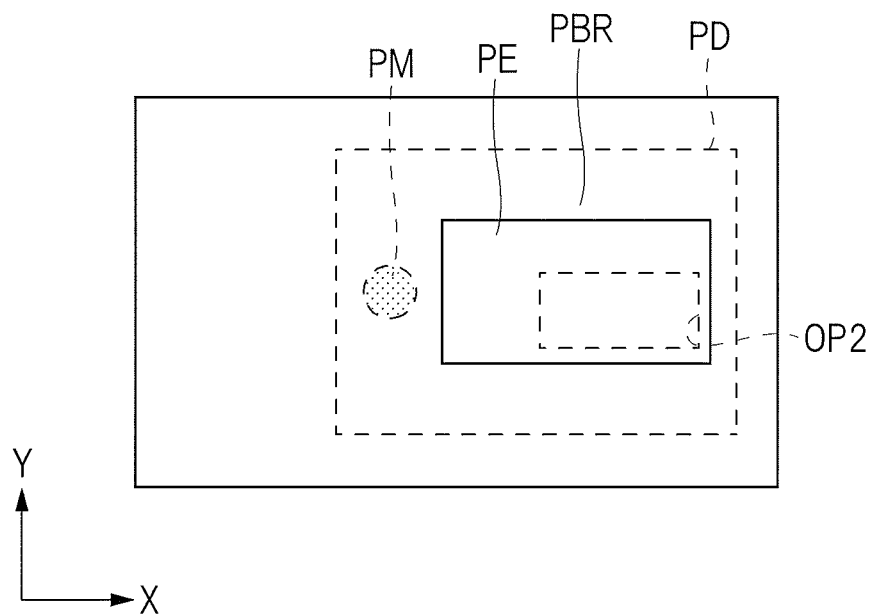
FIG. 41 is a plan view showing a structure of a pad according to a fourth modified example.

Subsequently, the fourth modified example of the embodiment will be explained. FIG. 41 is a plan view showing a pad structure according to the present fourth modified example. As shown in FIG. 41, in the present fourth modified example, the area of the contact surface between the pillar-shaped electrode PE and the protective insulating film PIF is increased in the X direction as well as in the Y direction, so that the center position of the pillar-shaped electrode PE and the center position of the opening region OP2 are shifted from each other in the X direction as well as in the Y direction. In other words, in the present fourth modified example, the positional shift between the center position of the pillar-shaped electrode PE opposed to the bonding fingers FNG and the center position of the opening region OP2 is generated in both of the long side direction and the short side direction of the pad PD. Here, in the pad PD arranged in the vicinity of the corner portion of the semiconductor chip, both of the X direction component and the Y direction component of the repetitive stress generated between the bonding finger FNG and the pad PD are increased, and therefore, it is effective to use a configuration in which the center position of the pillar-shaped electrode PE and the center position of the opening region OP2 are shifted from each other in both of the X direction and the Y direction as described in the present fourth modified example. That is, as the pad structure for the pad PD arranged in the vicinity of the corner portion of the semiconductor chip, the configuration of the present fourth modified example is desirable.

In the case of the present fourth modified example, by increasing the area of the contact surface between the pillar-shaped electrode PE and the protective insulating film PIF in the X direction as well as in the Y direction, the joining strength between the pad PD and the protective insulating film PIF is enhanced, so that the joining strength on the joining portion between the pad PD and the pillar-shaped electrode PE can be supported, and, as a result, the peeling off at the joining interface between the pad PD and the pillar-shaped electrode PE can be suppressed. Moreover, in the present fourth modified example, the center position of the opening region OP2 and the center position of the pillar-shaped electrode PE are shifted from each other in the X direction as well as in the Y direction. Therefore, when the stress based on the heat load is applied, the X-coordinate of the point of effort and the X-coordinate of the point of load are shifted from each other, and besides, the Y-coordinate of the point of effort and the Y-coordinate of the point of load is also shifted from each other. Therefore, in the bonding finger FNG connected to the pad PD arranged in the vicinity of the corner portion of the semiconductor chip, a repetitive stress generated relative to the pad PD tends to be generated in both of the X direction and the Y direction. For this reason, by applying the pad structure of the present fourth modified example to the pad PD arranged in the vicinity of the corner portion of the semiconductor chip, the magnitude of the stress applied onto the joining portion of the pillar-shaped electrode PD with the pad PD can be reduced, so that the peeling off at the joining interface between the pad PD and the pillar-shaped electrode PE can be suppressed.

FIFTH MODIFIED EXAMPLE

Figure 42:
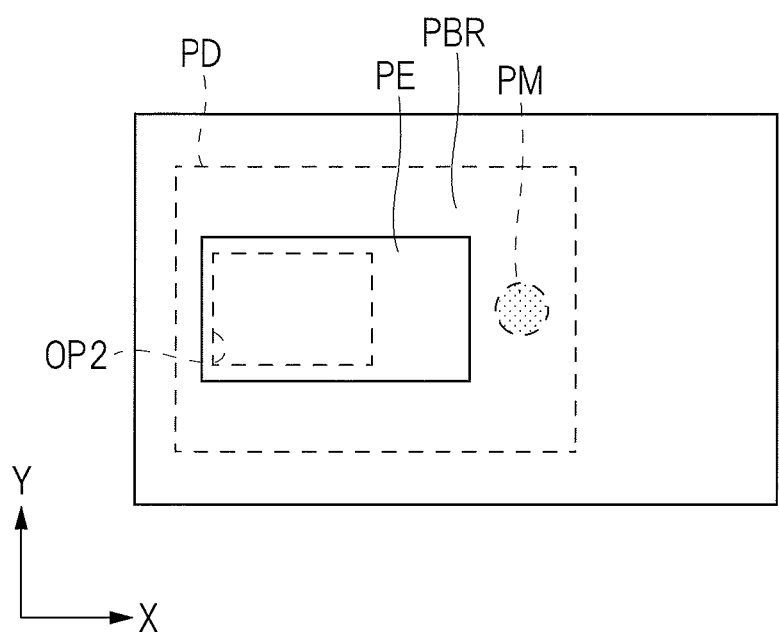
FIG. 42 is a plan view showing a structure of a pad according to a fifth modified example.

Next, the fifth modified example of the embodiment will be explained. FIG. 42 is a plan view showing a pad structure according to the present fifth modified example. As shown in FIG. 12, the embodiment has explained the pad structure in which the opening region OP2 is formed on the right side of the long side direction (X direction) of the pad PD and the probe mark PM is formed on the left side thereof. However, as described in the present fifth modified example shown in FIG. 42, a pad structure in which the opening region OP2 is formed on the left side of the long side direction (X direction) of the pad PD and the probe mark PM is formed on the right side thereof may be used.

More specifically, for example, as shown in FIG. 11, it is considered that the pad structure in the embodiment is applied to the outer circumferential pad of the plurality of pads arranged in the staggered arrangement of two rows. On the other hand, it is considered that the pad structure in the present fifth modified example is applied to the inner circumferential pad of the plurality of pads arranged in the staggered arrangement of two rows.

SIXTH MODIFIED EXAMPLE

Figure 43:
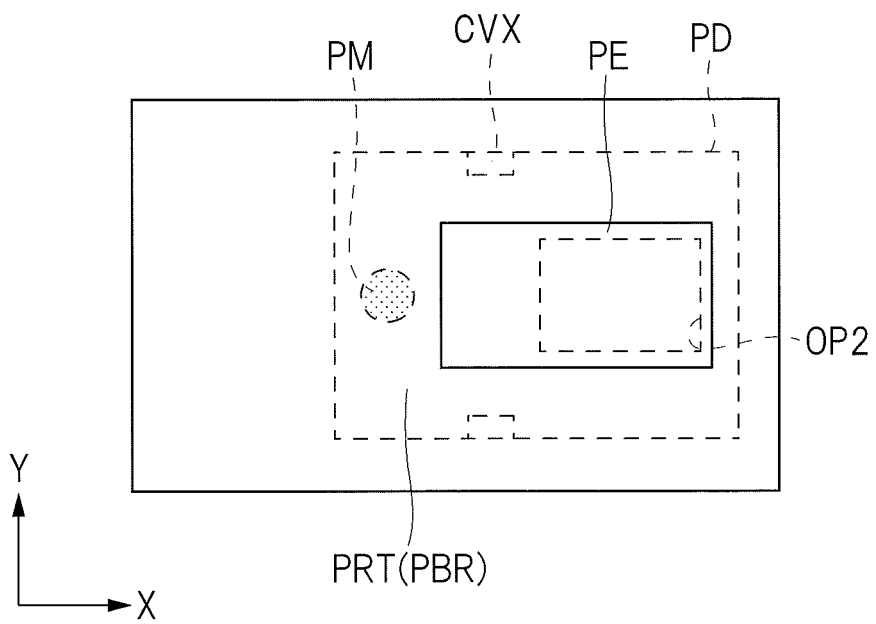
FIG. 43 is a plan view showing a structure of a pad according to a sixth modified example.

Subsequently, the sixth modified example of the embodiment will be explained. FIG. 43 is a plan view showing a pad structure according to the present sixth modified example. In FIG. 43, partially on the surface protective film (not shown in the drawing) for partially covering the pad PD, a convex portion CVX is formed. By this convex portion CVX, the right side region of the convex portion CVX and the left side region of the convex portion CVX can be distinguished from each other in the X direction of the pad PD. That is, by using the convex portion as a mark, the right side region of the convex portion CVX can be recognized as a region where the opening region OP2 is formed, and the left side region of the convex portion CVX is recognized as a region where a partial region PRT partially forming the probe region PBR is formed.

For example, in a stage for performing the electrical characteristic inspection by pressing the probe needle onto the pad PD, the protective insulating film PIF has not been formed yet, and the opening region OP2 to be formed on the protective insulating film PIF has not been formed yet, either. Therefore, it is difficult to determine which region of the surface region of the pad PD corresponds to the probe region PBR other than the opening region OP2. With respect to this point, in the present sixth modified example, the convex portion CVX is formed partially on the surface protective film for partially covering the pad PD. Therefore, by using the convex portion CVX as a mark, the right side region of the convex portion CVX can be recognized as a region where the opening region OP2 is formed, and the left side region of the convex portion CVX can be recognized as a region where the partial region PRT partially forming the probe region PBR is formed. As a result, according to the present sixth modified example, by pressing the probe needle onto the left side region of the convex portion CVX (partial region PRT) by using the convex portion as a mark without the provision of the dummy pad DP as seen in the embodiment, the probe needle is automatically pressed onto the probe region PBR other than the opening region OP2 of the pad PD. In the above-described manner, according to the present sixth modified example, the formation of the probe mark PM in the opening region OP2 of the surface region of the pad PD can be prevented.

SEVENTH MODIFIED EXAMPLE

Figure 44:
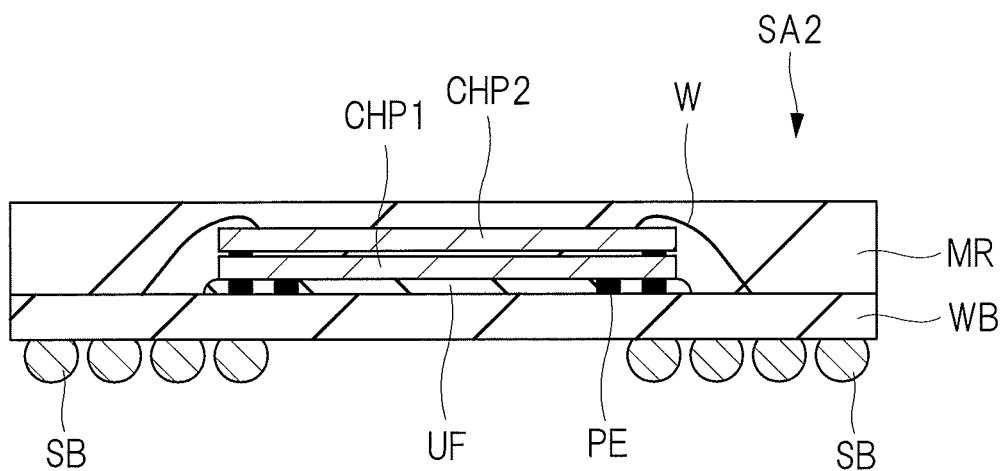
FIG. 44 is a cross-sectional view showing a mounting configuration of a semiconductor device according to a seventh modified example.

Next, the seventh modified example of the embodiment will be explained. FIG. 44 is a cross-sectional view showing a mounted configuration of a semiconductor device SA2 according to the seventh modified example. In FIG. 44, the semiconductor device SA2 of the present seventh modified example has a wiring substrate WB, and a plurality of solder balls SB are formed on a rear surface of the wiring substrate WB. On the other hand, a semiconductor chip CHP1 is mounted on the front surface of the wiring substrate WB, and a pillar-shaped electrode PE formed on the semiconductor chip CHP1 is connected to a terminal (bonding finger) (not shown) arranged on the front surface of the wiring substrate WB. And, in a gap between the semiconductor chip CHP1 and the wiring substrate WB, a sealing material UF is filled.

Moreover, in the semiconductor device SA2 of the present seventh modified example, a semiconductor chip CHP2 is stacked and arranged on the semiconductor chip CHP1, and the semiconductor chip CHP2 and the wiring substrate WB are electrically connected to each other by, for example, a wire W made of a gold wire. And, a sealing resin MR is formed so as to cover the semiconductor chip CHP1 and the semiconductor chip CHP2 which are stacked and arranged. The semiconductor device SA2 in the present seventh modified example configured as described above is also common with, for example, the semiconductor device SA in the embodiment shown in FIG. 2 in the point that the semiconductor chip CHP1 is connected to the wiring substrate WB by the pillar-shaped electrode PE, and therefore, the technical concept of the embodiment can also be applied to the semiconductor device SA2 of the present seventh modified example.

More particularly, in the present seventh modified example, since the sealing resin MR is provided, and since a heat load is also applied in a step of forming the sealing resin MR, such a technical significance as applying the technical concept of the embodiment to the present seventh modified embodiment becomes large.

Note that the technical concept of the embodiment can be applied widely to, for example, a semiconductor device having a heat radiating plate, or a semiconductor device having a so-called POP (Package On Package) configuration having another second semiconductor device mounted on a first semiconductor device, or others although not shown in the drawings.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-described embodiment, the explanation has been made by exemplifying a BGA (Ball Grid Array) as a packaging mode of the semiconductor device. However, the technical concept of the above-described embodiment can also be applied to a packaging mode referred to as a LGA (Land Grid Array).

What is claimed is:

1. A semiconductor device comprising:
   (a) a wiring substrate including a first surface and a bonding finger formed on the first surface; and
   (b) a semiconductor chip including a main surface, a pad formed on the main surface, a protective insulating film formed on the pad, and a pillar-shaped electrode formed on an opening region of the pad exposed from the protective insulating film, the semiconductor chip being electrically connected to the bonding finger of the wiring substrate via the pillar-shaped electrode, the main surface of the semiconductor chip is opposed to the first surface of the wiring substrate,
   wherein a probe mark is formed on a probe region of the pad that is covered with the protective insulating film,
   the pillar-shaped electrode comprises:
   a first portion formed on the opening region; and
   a second portion formed on the protective insulating film covering the probe region,
   wherein, in a plan view, the pillar-shaped electrode is included within the pad,
   a center position of the opening region is offset from a center position of the pillar-shaped electrode that is opposed to the bonding finger, and the center position of the opening region is offset from a center position of the pad, and wherein, with respect to the center position of the pad in a plan view, the probe mark is disposed on an opposite side of the pad than the center position of the opening region.

2. The semiconductor device according to claim 1, wherein the probe region is a region other than the opening region, which is a surface region of the pad that is exposed when the protective insulating film is removed.

3. The semiconductor device according to claim 1, wherein the second portion of the pillar-shaped electrode is extended toward the probe mark.

4. The semiconductor device according to claim 3, wherein the second portion of the pillar-shaped electrode includes the probe mark when seen in a plan view.

5. The semiconductor device according to claim 1, wherein the pad has a rectangular shape, and the opening region and the probe mark are aligned in a long side direction of the pad.

6. The semiconductor device according to claim 5, wherein the center position of the pillar-shaped electrode that is opposed to the bonding finger and the center position of the opening region is offset in the long side direction of the pad.

7. The semiconductor device according to claim 1, wherein a dummy pad is disposed on the semiconductor chip, and the dummy pad specifies a position of the probe region in the surface region of the pad before formation of the opening region.

8. The semiconductor device according to claim 7, wherein the dummy pad is disposed on the semiconductor chip along an arrangement direction of the plurality of the pads including the pad, and wherein the dummy pad is disposed so that the surface region of the pad overlaps with a surface region of the dummy pad in the probe region of the pad.

9. The semiconductor device according to claim 1, further comprising:
a surface protective film formed on the main surface so as to partially cover the pad,
wherein an exposed region of the pad exposed from the surface protective film is formed of the opening region and the probe region, and
a convex portion having a function for distinguishing the opening region from a partial region partially forming the probe region is formed on the surface protective film when seen in a plan view.

10. A semiconductor device comprising:
(a) a wiring substrate including a first surface and a bonding finger formed on the first surface; and
(b) a semiconductor chip including a main surface, a pad formed on the main surface, a protective insulating film formed on the pad, and a pillar-shaped electrode formed on an opening region of the pad exposed from the protective insulating film, the semiconductor chip being electrically connected to the bonding finger of the wiring substrate via the pillar-shaped electrode, the main surface is opposed to the first surface of the wiring substrate,
wherein a probe mark is disposed on a probe region of the pad that is covered with the protective insulating film, the pillar-shaped electrode comprises:
a first portion formed on the opening region; and
a second portion formed on the protective insulating film covering the probe region,
wherein the pillar-shaped electrode includes a first electrode side that is closest to the probe mark and a second electrode side that is opposed to the first electrode side in a plan view among a plurality of electrode sides of the pillar-shaped electrode,
wherein the opening region includes a first opening side that is closest to the probe mark and a second opening side that is opposed to the first opening side in a plan view among a plurality of opening sides of the opening region, and
wherein in a plan view, a distance from the first electrode side of the pillar-shaped electrode to the first opening side of the opening region is greater than a distance from the second electrode side of the pillar-shaped electrode to the second opening side of the opening region.

11. The semiconductor device according to claim 10, wherein the probe region is a region other than the opening region, which is a surface region of the pad that is exposed when the protective insulating film is removed.

12. The semiconductor device according to claim 11, wherein the second portion of the pillar-shaped electrode is extended toward the probe mark.

13. The semiconductor device according to claim 12, wherein the second portion of the pillar-shaped electrode includes the probe mark when seen in a plan view.

14. The semiconductor device according to claim 10, wherein the pad has a rectangular shape, and the opening region and the probe mark are aligned in a long side direction of the pad.

15. The semiconductor device according to claim 14, wherein the first electrode end and the second electrode end of the pillar-shaped electrode and the first opening end and the second opening end of the opening region are aligned in the long side direction of the pad.

16. The semiconductor device according to claim 10, wherein a dummy pad is disposed on the semiconductor chip, and the dummy pad specifies a position of the probe region in the surface region of the pad before formation of the opening region.

17. The semiconductor device according to claim 16, wherein the dummy pad is disposed on the semiconductor chip along an arrangement direction of the plurality of the pads including the pad, and wherein the dummy pad is disposed so that the surface region of the pad overlaps with a surface region of the dummy pad in the probe region of the pad.

18. The semiconductor device according to claim 10, further comprising:
a surface protective film formed on the main surface so as to partially cover the pad,
wherein an exposed region of the pad exposed from the surface protective film is formed of the opening region and the probe region, and
a convex portion having a function for distinguishing the opening region from a partial region partially forming the probe region is formed on the surface protective film when seen in a plan view.

* * * * *